(12) United States Patent
Kang et al.

(10) Patent No.: US 12,300,309 B2
(45) Date of Patent: May 13, 2025

(54) MEMORY DEVICE

(71) Applicant: Samsung Electronics Co., Ltd., Suwon-si (KR)

(72) Inventors: Jungmyung Kang, Hwaseong-si (KR); Hoyoung Tang, Suwon-si (KR); Inhak Lee, Hwaseong-si (KR); Sangyeop Baeck, Yongin-si (KR); Dongwook Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 258 days.

(21) Appl. No.: 17/881,187

(22) Filed: Aug. 4, 2022

(65) Prior Publication Data

US 2023/0162784 A1 May 25, 2023

(30) Foreign Application Priority Data

Nov. 24, 2021 (KR) ........................ 10-2021-0162956

(51) Int. Cl.
  *G11C 16/04* (2006.01)
  *G11C 11/4074* (2006.01)
  *G11C 11/4094* (2006.01)
  *G11C 11/4096* (2006.01)

(52) U.S. Cl.
  CPC ...... *G11C 11/4096* (2013.01); *G11C 11/4074* (2013.01); *G11C 11/4094* (2013.01)

(58) Field of Classification Search
  CPC ............ G11C 11/4096; G11C 11/4074; G11C 11/4094
  See application file for complete search history.

(56) References Cited

U.S. PATENT DOCUMENTS

| | | | |
|---|---|---|---|
| 4,639,895 A * | 1/1987 | Iwahashi | G11C 29/83 365/200 |
| 8,730,712 B2 | 5/2014 | Choi | |
| 9,478,273 B2 * | 10/2016 | Dray | G11C 11/1655 |
| 10,049,728 B2 * | 8/2018 | Kim | G11C 11/419 |
| 10,176,863 B2 | 1/2019 | Liaw | |
| 10,672,776 B2 | 6/2020 | Chen et al. | |
| 10,854,278 B2 | 12/2020 | Liaw | |
| 10,867,669 B2 | 12/2020 | Chen et al. | |
| 10,878,855 B1 | 12/2020 | Lin et al. | |
| 10,916,551 B2 | 2/2021 | Liaw | |
| 10,971,220 B2 | 4/2021 | Singh et al. | |
| 10,984,856 B2 | 4/2021 | Liaw | |
| 2015/0302917 A1 | 10/2015 | Grover et al. | |

* cited by examiner

*Primary Examiner* — Pho M Luu
(74) *Attorney, Agent, or Firm* — Harness, Dickey & Pierce, P.L.C.

(57) ABSTRACT

A memory device includes a bit cell array including a plurality of bit cells connected to a first auxiliary line to which a cell power voltage is supplied; a write driver configured to apply a bit line voltage corresponding to write data to a bit line extending in a column direction of the bit cell array during a write operation; and a write auxiliary circuit connected to the first auxiliary line and a second auxiliary line extending in parallel to the first auxiliary line, and configured to lower a cell power voltage for a first bit cell spaced apart from the write driver during the write operation, wherein the cell power voltage is supplied to the first auxiliary line through the second auxiliary line, and in sequence from the first bit cell to a second bit cell adjacent to the write driver through the first auxiliary line.

20 Claims, 19 Drawing Sheets

MEMORY DEVICE

CROSS-REFERENCE TO RELATED APPLICATION(S)

This application claims benefit of priority to Korean Patent Application No. 10-2021-0162956 filed on Nov. 24, 2021 in the Korean Intellectual Property Office, the disclosure of which is incorporated herein by reference in its entirety.

BACKGROUND

Example embodiments of the present disclosure relate to a memory device.

A semiconductor memory device may include a volatile memory device in which stored data is destroyed when power thereto is cut off and a nonvolatile memory device which may retain stored data even when power thereto is cut off. Depending on a method of storing data, a volatile memory device may include a static random access memory (SRAM) storing data using latches, a dynamic random access memory (DRAM) storing data using capacitor data, and/or the like. Since a SRAM may have a small memory capacity, as a SRAM has low integration density as compared to a DRAM, the configuration of a peripheral circuit of a SRAM may be simplified and a SRAM may operate at high speed, such that a SRAM may be mainly used as a cache memory of a controller. Recently, as the number of semiconductor processes has been increased, the demand for and dispersion of properties, such as static noise margin, write margin, and sense margin, has also increased, which may decrease operation stability of a memory device.

SUMMARY

An example embodiment of the present disclosure is to provide a memory device which may increase a speed of a write operation and may reduce power consumed during a write operation.

According to an example embodiment of the present disclosure, a memory device includes a bit cell array including a plurality of bit cells configured to receive a cell power voltage from a first auxiliary line; a write driver connected to the bit cell array such that the plurality of bit cells includes a first bit cell spaced apart from the write driver in a column direction of the bit cell array and a second bit cell adjacent to the write driver in the column direction, the write driver configured to apply a bit line voltage, corresponding to write data, to a bit line extending in the column direction during a write operation; and a write auxiliary circuit connected to the first auxiliary line and a second auxiliary line extending in parallel to the first auxiliary line, the write auxiliary circuit configured to, for at least the first bit cell, lower a level of the cell power voltage, wherein the memory device is configured such that the cell power voltage is supplied to the first auxiliary line through the second auxiliary line, and is supplied sequentially from the first bit cell to the second bit cell through the first auxiliary line.

According to an example embodiment of the present disclosure, a memory device includes a bit cell array including a plurality of bit cells; a bit cell dummy array on one side of the bit cell array; a write driver on a side of the bit cell array opposite the bit cell dummy array, the write driver configured to apply a bit line voltage corresponding to write data to a bit line extending in a column direction of the bit cell array during a write operation; and a write auxiliary circuit connected to a first auxiliary line and a second auxiliary line, the first auxiliary line configured to supply a cell power voltage to the plurality of bit cells, and the second auxiliary line connected to the first auxiliary line in the bit cell dummy array and configured to transfer the cell power voltage to the first auxiliary line.

According to an example embodiment of the present disclosure, a memory device includes a bit cell array including a plurality of bit cells; a plurality of bit lines in a lower auxiliary line layer on the bit cell array and configured to extend in a column direction of the bit cell array; a plurality of first auxiliary lines in the lower auxiliary line layer and extending in parallel with the plurality of bit lines, the plurality of first auxiliary lines configured to apply a cell power voltage to the plurality of bit cells; a plurality of second auxiliary lines in an upper auxiliary line layer on the lower auxiliary line layer and in parallel with the plurality of first auxiliary lines, the plurality of second auxiliary lines connected to the plurality of first auxiliary lines in a bit cell dummy array on one side of the bit cell array such that a direction in which a bit line voltage is applied and a direction in which the cell power voltage is applied are opposite to each other.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Figure 1:
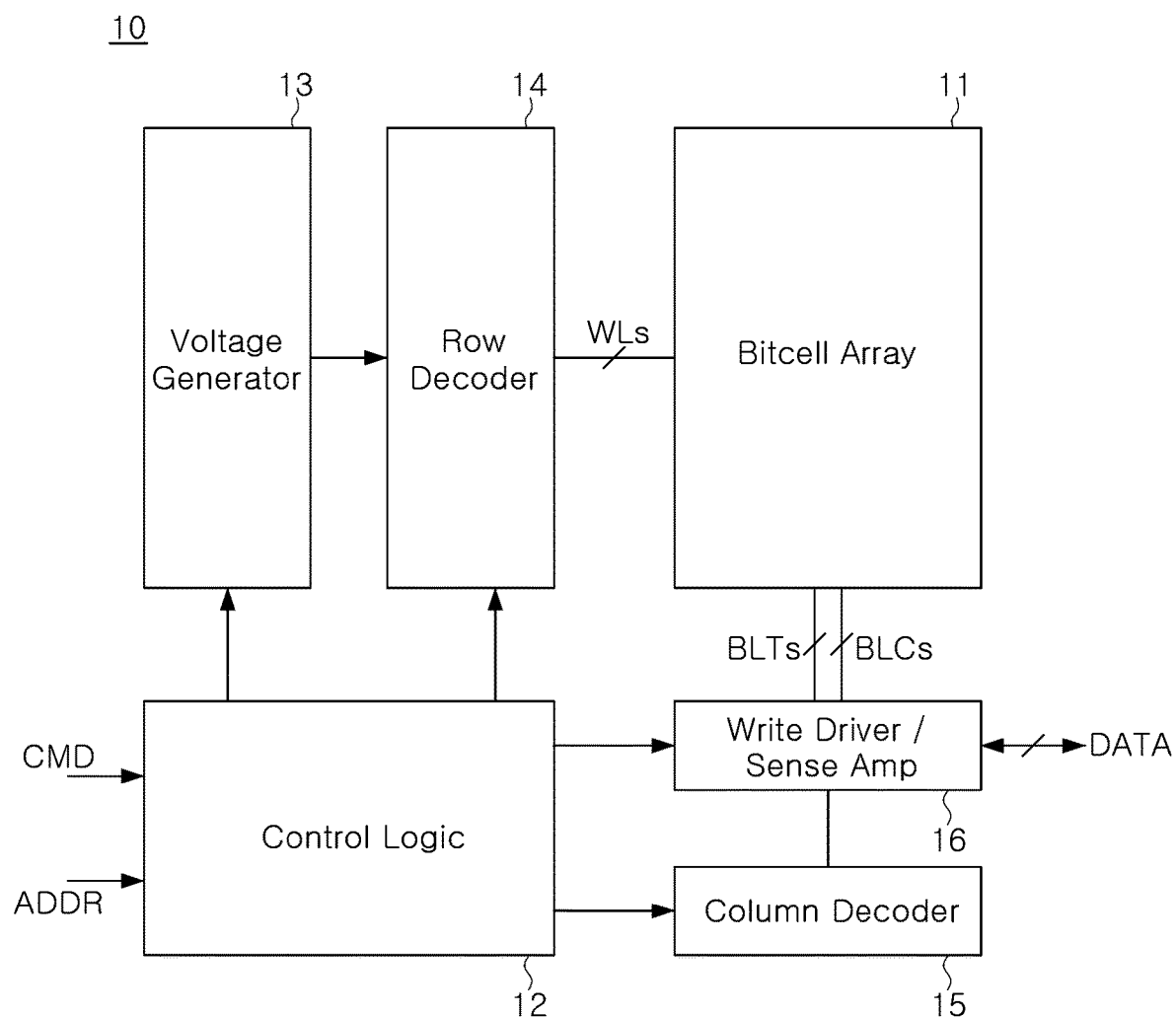
FIG. 1 is a block diagram illustrating a memory device according to some example embodiments of the present disclosure.

Hereinafter, some example embodiments of the present disclosure will be described as follows with reference to the accompanying drawings. Throughout the drawings, the size or thickness of each constituent element illustrated in the drawings may be exaggerated for convenience of explanation and clarity.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Functional elements in the detailed description and the corresponding blocks shown in the drawings, unless indicated otherwise, may be implemented in processing circuitry such as hardware, software, or a combination thereof configured to perform a specific function. For example, the processing circuitry may include electrical components such as at least one of transistors, resistors, capacitors, etc. and/or may include electrical components such as logic gates including at least one of AND gates, OR gates, NAND gates, NOT gates, XOR gates, etc.

Recently, due to an increase in the size of an amount of data stored in the memory device, a memory device having an improved integration density may be desired and/or necessary. To improve integration density of a memory device and to increase storage capacity, the number of memory cells included in the memory device may increase. A collection of memory cells included in the memory device may be included in a memory cell array, and as the number of memory cells increases, the size of the memory cell array may increase.

FIG. 1 is a block diagram illustrating a memory device according to some example embodiments.

Referring to FIG. 1, a memory device 10 may include a bit cell array 11, a control logic 12, a voltage generator 13, a row decoder 14, a column decoder 15, and a write driver/sense amplifier 16. The memory device 10 may be implemented as a static random access memory (SRAM), but the example embodiments thereof are not limited thereto.

The bit cell array 11 may include a plurality of word lines WL, a plurality of bit lines BL, and a plurality of bit cells BC configured to store data. In some example embodiments, each of the plurality of bit lines BL may be provided as a differential bit line including a bit line BLT and a complementary bit line BLC. Each of the bit lines BLT and BLC may input data provided from the write driver 16 to the bit cell BC disposed in a position intersecting a selected word line of the plurality of word lines WL.

The control logic 12 may control operations of a voltage generator 13, a row decoder 14, a column decoder 15, and a write driver/sense amplifier 16 based on an instruction (CMD), an address (ADDR), and a control signal input from an external entity.

For example, during a write operation, the control logic 12 may control the row decoder 14 to apply a word line voltage to the plurality of word lines WL based on an electrical signal output by the voltage generator 13. The control logic 12 may control various peripheral circuits including the write driver 16 and may apply a bit line voltage to the bit lines BLT and BLC selected by the column decoder 15. Accordingly, the control logic 12 may input data to the bit cell BC selected by the row decoder 14 and the column decoder 15.

The row decoder 14 may decode a row address applied from the control logic 12 and may select one of the plurality of word lines WL according to the result of the decoding. During a write operation, the row decoder 14 may supply a word line voltage at a high level to the word line WL selected based on the row address. Also, the row decoder 14 may supply a word line voltage to the unselected word lines WL at a low level based on the row address.

The column decoder 15 may decode the column address applied from the control logic 12 and may select at least one of the plurality of bit lines BLT and BLC according to the result of the decoding. A logic value provided by the write driver 16 may be written to the bit cell BC selected by the column decoder 15.

The write driver 16 may write data input, e.g., according to the control of the control logic 12, in the selected bit cells BC of the bit cell array 11 during a write operation. For example, the write driver 16 may input data to be written in the bit cell array 11 to the selected bit cells BC through the bit lines BLT and BLC.

The plurality of bit cells BC may be connected to power lines formed in a direction parallel to the bit lines BLT and BLC. The plurality of bit cells BC may be driven based on a cell power voltage supplied through the power lines. For example, in some example embodiments, the bit lines BLT and BLC and the power lines may be formed on the same semiconductor layer.

The memory device 10 in some example embodiments may supply a cell power voltage to the plurality of bit cells BC using a write auxiliary circuit (not illustrated). The write auxiliary circuit may be connected to a plurality of auxiliary lines connected to the plurality of bit cells BC. In some example embodiments, a power line (e.g., for supplying a cell power voltage to the plurality of bit cells BC) may be referred to as a first auxiliary line.

The memory device 10 in some example embodiments may provide a cell supply voltage from a first auxiliary line in a direction opposite to the direction in which the bit line voltage is supplied from the write driver 16 using a second auxiliary line connected to a write auxiliary circuit. Accordingly, the memory device 10 may, by preferentially performing a write auxiliary operation on the bit cells BC spaced apart from the write driver 16, increase a speed of the write operation and/or reduce the power consumption.

Figure 2:
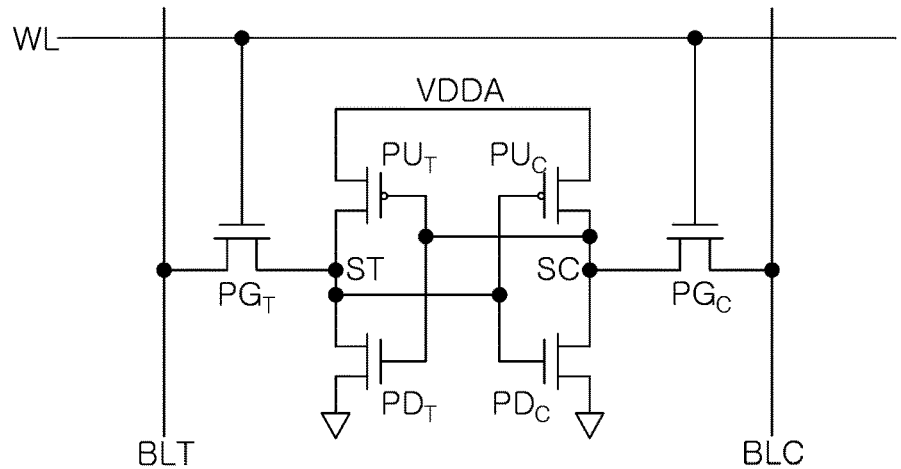
FIG. 2 is a circuit diagram illustrating a bit cell included in a memory device according to some example embodiments of the present disclosure.

FIG. 2 is a circuit diagram illustrating a bit cell included in a memory device according to some example embodiments.

Referring to FIG. 2, the memory device 10 may include a bit cell array 11 including a plurality of bit cells BC. In some example embodiments, a bit cell BC may include a first pass gate transistor $PG_T$, a second pass gate transistor $PG_C$, a first pull-up transistor $PU_T$, a second pull-up transistor $PU_C$, a first pull-down transistor $PD_T$, and a second pull-down transistors $PD_C$.

In some example embodiments, the pull-up transistors $PU_T$ and $PU_C$ may include a different charge type compared to the pull-down transistors $PD_T$ and $PD_C$. For example, the first pull-up transistor $PU_T$ and the second pull-up transistor $PU_C$ may be p-channel metal-oxide-semiconductor (PMOS) transistors, and the first pull-down transistor $PD_T$ and the second pull-down transistor $PD_C$ may be n-channel MOS (NMOS) transistors. However, the example embodiments thereof are not limited thereto.

The first pull-up transistor $PU_T$ and the first pull-down transistor $PD_T$ may be included in a first inverter, and the second pull-up transistor $PU_C$ and the second pull-down transistor $PD_C$ may be included in a second inverter. For example, the first inverter and the second inverter may be connected to each other by a cross-coupled inverter.

A source terminal of each of the first pull-down transistor $PD_T$ and the second pull-down transistor $PD_C$ may be connected to a first voltage (e.g., a ground voltage VSS). Also, a source terminal of each of the first pull-up transistor $PU_T$ and the second pull-up transistor $PU_C$ may be connected to a second voltage (e.g., a cell power voltage VDDA). In the example embodiment, VDDA, which refers to a cell power voltage, may also refer to a first auxiliary line for supplying a cell power voltage.

Drain terminals of the pull-up transistors $PU_T$ and $PU_C$ may be connected to drain terminals of the corresponding pull-down transistors $PD_T$ and $PD_C$, respectively. Also, an input of the first inverter may be connected to an output node SC of the second inverter, and an input of the second inverter may be connected to an output node ST of the first inverter.

A gate terminal of the first pass gate transistor $PG_T$ may be connected to the word line WL, the drain terminal thereof may be connected to the bit line BLT, and the source terminal may be connected to the output node ST of the first inverter. A gate terminal of the second pass gate transistor $PG_C$ may be connected to the word line WL, the drain terminal thereof may be connected to the complementary bit line BLC, and the source terminal may be connected to the output node SC of the second inverter.

The memory device 10 may store data by a positive-feedback phenomenon. For example, when the word line WL is activated to a high level, the first pass gate transistor $PG_T$ and the second pass gate transistor $PG_C$ of the plurality of bit cells BC may be turned on. In this case, signals applied to the bit lines BLT and BLC corresponding to the data signal may be transmitted to the first inverter and the second inverter, respectively. Accordingly, the memory device 10 may read data stored in each of the output nodes ST and SC of the first inverter and the second inverter, and/or may store a signal applied to the bit lines BLT and BLC to the output nodes ST and SC of the first inverter and the second inverter, respectively.

Figure 3:
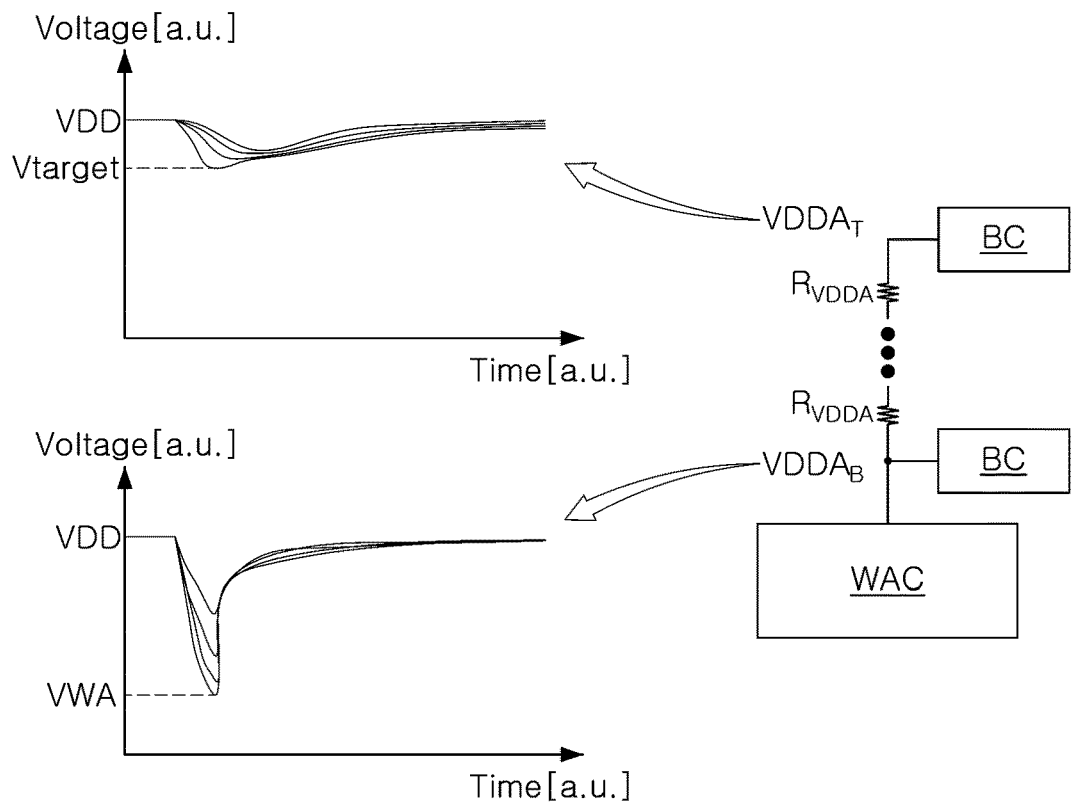
FIG. 3 is a diagram illustrating an operation of a write auxiliary circuit included in a memory device according to some example embodiments of the present disclosure.

FIG. 3 is a diagram illustrating an operation of a write auxiliary circuit included in a memory device according to some example embodiments.

As the process of manufacturing a semiconductor is refined, power consumption and an area of a memory device have been continuously reduced, but as a width of metal wirings included in the memory device decreases, the magnitude of resistance in the wiring may also increase. Particularly, when a width of the bit lines BLT and BLC included in the memory device decreases, resistance of the bit lines BLT and BLC may increase, and as the memory device is integrated, capacitance (e.g., parasitic capacitance) of the bit lines BLT and BLC may increase. The above-described change may deteriorate performance of the write operation of the plurality of bit cells BC included in the memory device.

To improve a write margin in the plurality of bit cells BC, it may be beneficial and/or necessary to reduce the amount of current flowing through the pull-up transistors (e.g., $PU_T$ and $PU_C$ of FIG. 2). The amount of current flowing through the pull-up transistors may be controlled by a level of the cell power voltage. For example, when a level of the cell power voltage decreases, the amount of current flowing through the pull-up transistors may also decrease.

Referring to FIG. 3, to address the above issue, in the memory device 10, a write auxiliary circuit WAC, which may reduce the cell power voltages $VDDA_T$ and $VDDA_B$ supplied to the plurality of bit cells BC, may be applied to the memory device 10. The memory device 10 may stably operate the plurality of bit cells BC during a write operation in which data is stored in the plurality of bit cells BC using the write auxiliary circuit WAC.

For example, the write auxiliary circuit WAC may reduce the levels of the cell power voltages $VDDA_T$ and $VDDA_B$ such that the pull-up transistor (e.g., $PU_T$ and $PU_C$ of FIG. 2) may be relatively easily turned on even when the signal applied to the pass-gate transistor is weak, such that a low signal of the bit line BL may be relatively easily input to the bit cell BC.

However, as shown in FIG. 3, to reduce the cell power voltage $VDDA_T$ supplied to the bit cell BC (which is disposed to be spaced apart from the write auxiliary circuit WAC) to the target voltage Vtarget, the cell power voltage $VDDA_B$ supplied to the bit cell BC (which is disposed adjacent to the write auxiliary circuit WAC) may also need to be reduced.

For example, since the write auxiliary circuit WAC may perform a write auxiliary operation in the direction of the bit cell BC spaced apart from the write auxiliary circuit WAC, a reduced level of the cell power voltage $VDDA_B$ supplied to the bit cell BC adjacent to the write auxiliary circuit WAC may be larger than a reduced level of the cell power voltage $VDDA_T$ supplied to the bit cell BC spaced apart from the write auxiliary circuit WAC. Accordingly, the power consumed to reduce the cell power voltage $VDDA_T$ supplied to the bit cell BC spaced apart from the write auxiliary circuit WAC to the target voltage Vtarget may increase, and/or the time for which the cell power voltage $VDDA_T$ reaches the target voltage may also be delayed.

For example, in the case wherein the write auxiliary circuit WAC supplies lower cell power voltages $VDDA_T$ and $VDDA_B$ in a direction toward the bit cell BC spaced apart from the write auxiliary circuit WAC, the increase and decrease of voltage may be affected by the resistance $R_{VDDA}$ of the first auxiliary line supplying the cell power voltages $VDDA_T$ and $VDDA_B$ and/or capacitance of the first auxiliary line.

Figure 4:
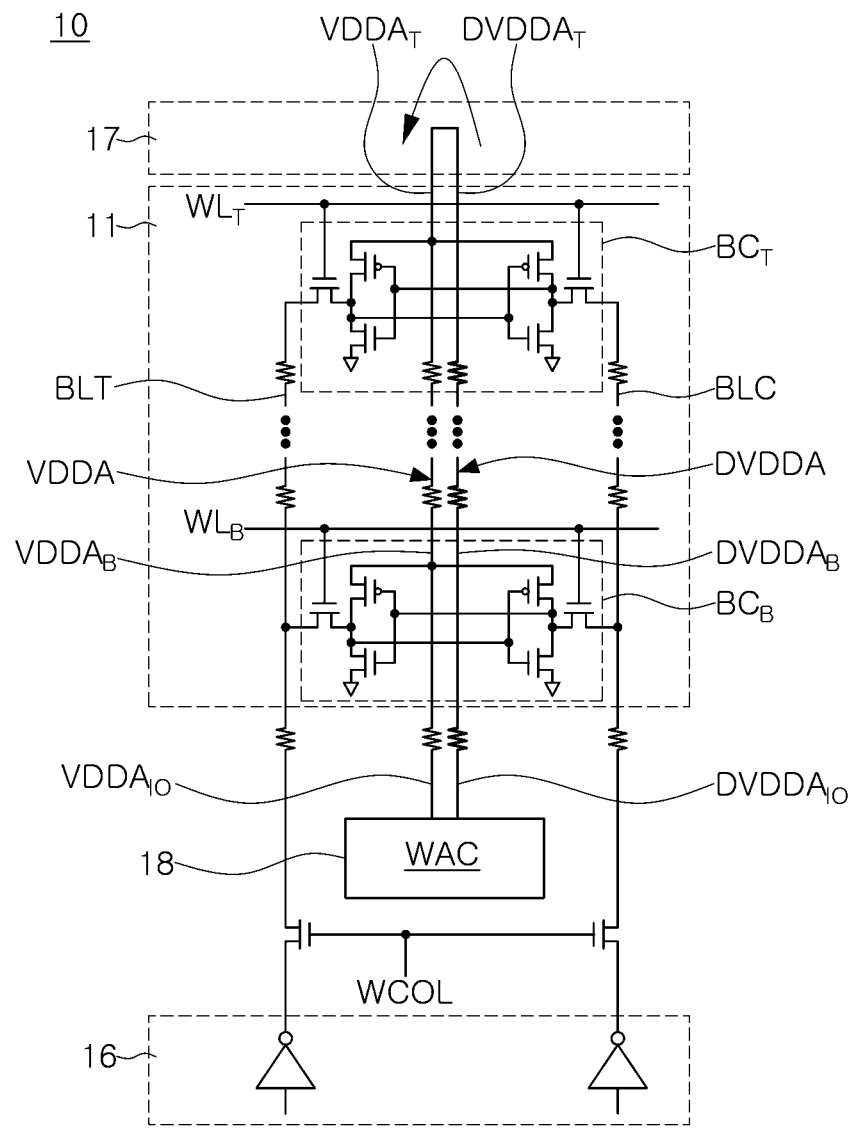
FIG. 4 is a diagram illustrating a structure of a memory device according to some example embodiments of the present disclosure.

FIG. 4 is a diagram illustrating a structure of a memory device according to some example embodiments.

Referring to FIG. 4, the memory device 10 may include a bit cell array 11, a bit cell dummy array 17, a write driver 16, and a write auxiliary circuit WAC. The write auxiliary circuit WAC may be connected to the first auxiliary line VDDA and the second auxiliary line DVDDA.

The bit cell array 11 may include a plurality of bit cells $BC_T$ and $BC_B$ connected to the first auxiliary line VDDA supplying the cell power voltages $VDDA_{IO}$, $VDDA_B$, and $VDDA_T$. The bit cell array 11 illustrated in FIG. 4 includes only the plurality of bit cells $BC_T$ and $BC_B$ arranged in the column direction, but the example embodiments thereof are not limited thereto.

For example, the plurality of bit cells $BC_T$ and $BC_B$ included in the bit cell array 11 may be arranged in a row direction in which the word lines WLT and WLB extend and a column direction in which the bit lines BLT and BLC extend. A bit cell spaced apart from the write driver 16 may be referred to as a first bit cell $BC_T$, and a bit cell adjacent to the write driver 16 may be referred to as a second bit cell $BC_B$.

The bit cell dummy array 17 may be disposed on one side of the bit cell array 11, and the write driver 16 may be disposed on the other side of the bit cell array 11. The write driver 16 may apply a bit line voltage corresponding to write data to the bit lines BLT and BLC (extending in the column direction of the plurality of bit cells $BC_T$ and $BC_B$) during a write operation.

Since the bit lines BLT and BLC may rapidly reach a low level in a portion connected to the second bit cell $BC_B$ adjacent to the write driver 16, in the second bit cell $BC_B$, a write operation may be performed swiftly even when no write auxiliary circuit WAC is present. However, in a portion connected to the first bit cell $BC_T$ spaced apart from the write driver 16, the bit lines BLT and BLC may slowly reach a low level. Accordingly, a write operation on the first bit cell $BC_T$ and also the plurality of bit cells $BC_T$ and $BC_B$ may be performed faster using the write auxiliary circuit WAC.

As described above, the write auxiliary circuit WAC may reduce the cell power voltages $VDDA_T$ and $VDDA_B$ supplied to the plurality of bit cells BC during the write operation and may secure a write margin, thereby reducing the time taken for the write operation. In the first bit cell $BC_T$ spaced apart from the write driver 16, the discharge of the bit line may occur proceed slower than that of the second bit cell $BC_B$ disposed adjacent to the write driver 16. To compensate for this, the cell power voltages $VDDA_T$ and $VDDA_B$ may be reduced by a greater level.

The memory device 10 in an example embodiment may extend in parallel to the first auxiliary line VDDA and may include a second auxiliary line DVDDA configured to transfer the cell power voltages $DVDDA_{IO}$, $DVDDA_B$, and $DVDDA_T$ to the first auxiliary line VDDA. For example, the cell power voltages $DVDDA_{IO}$, $DVDDA_B$, and $DVDDA_T$ may be supplied to the first auxiliary line VDDA through the second auxiliary line DVDDA, and the cell power voltages $VDDA_{IO}$, $VDDA_B$, and $VDDA_T$ may be supplied to the plurality of bit cells $BC_T$ and $BC_B$ through the first auxiliary line VDDA.

The second auxiliary line DVDDA may be disposed on the first auxiliary line VDDA. The ends of the second auxiliary line DVDDA may be connected to the write auxiliary circuit WAC and the first auxiliary line VDDA, respectively. The second auxiliary line DVDDA may be connected to the first auxiliary line VDDA in the bit cell dummy array 17 and may be separated from the plurality of bit cells $BC_T$ and $BC_B$ and/or other lines.

In the memory device 10, the cell power voltages $VDDA_{IO}$, $VDDA_B$, and $VDDA_T$ for driving the plurality of bit cells $BC_T$ and $BC_B$ may be supplied sequentially in the direction of the second bit cell $BC_B$ disposed adjacent to the write auxiliary circuit WAC from the first bit cell $BC_T$ disposed to be spaced apart from the write auxiliary circuit WAC. That is, the direction in which the bit line voltage is supplied from the write driver 16 and the direction in which the cell power voltages $VDDA_{IO}$, $VDDA_B$, and $VDDA_T$ are supplied from the first auxiliary line VDDA may be opposite to each other.

In the memory device 10, the effect of the write auxiliary operation by the write auxiliary circuit WAC in the first bit cell $BC_T$ spaced apart from the write driver 16 may appear the greatest. For example, the write auxiliary circuit WAC may reduce the cell power voltage VCCAT supplied to the first bit cell $BC_T$ by the greatest decrease.

Accordingly, in the memory device 10, by reducing the unnecessary write auxiliary operation for the second bit cell $BC_B$ adjacent to the write auxiliary circuit WAC and the bit cells adjacent to the second bit cell $BC_B$, a speed of a write operation may improve and power consumption may be reduced.

Also, in the memory device 10, the second auxiliary line DVDDA may be additionally disposed, and the memory device 10 may not require a bit cell strap and/or a multiplexer circuit, and therefore an increase in the available area may occur.

Figure 5:
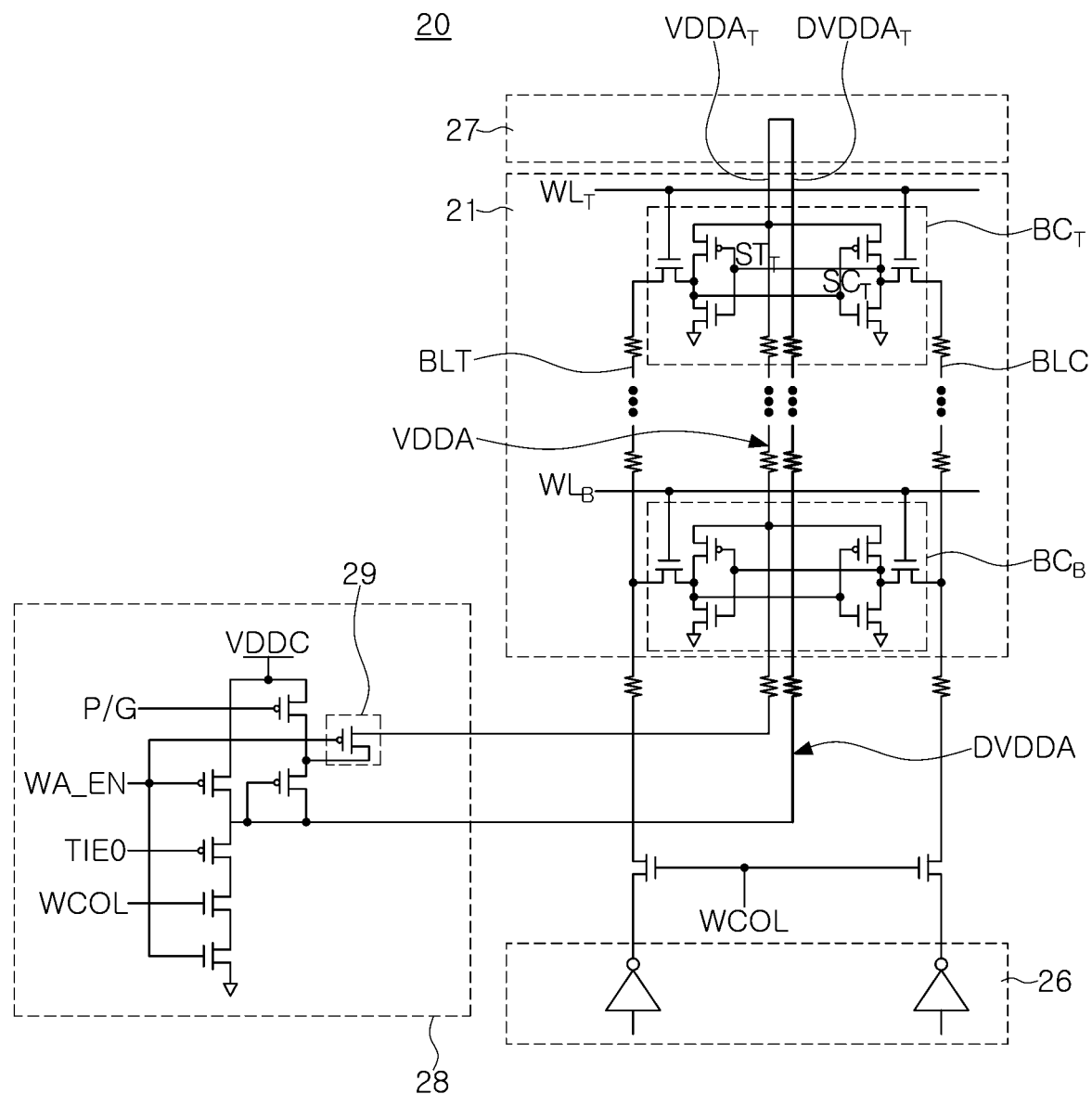
FIG. 5 is a diagram illustrating a memory device and a structure of a write auxiliary circuit included therein according to some example embodiments of the present disclosure.
Figure 6:
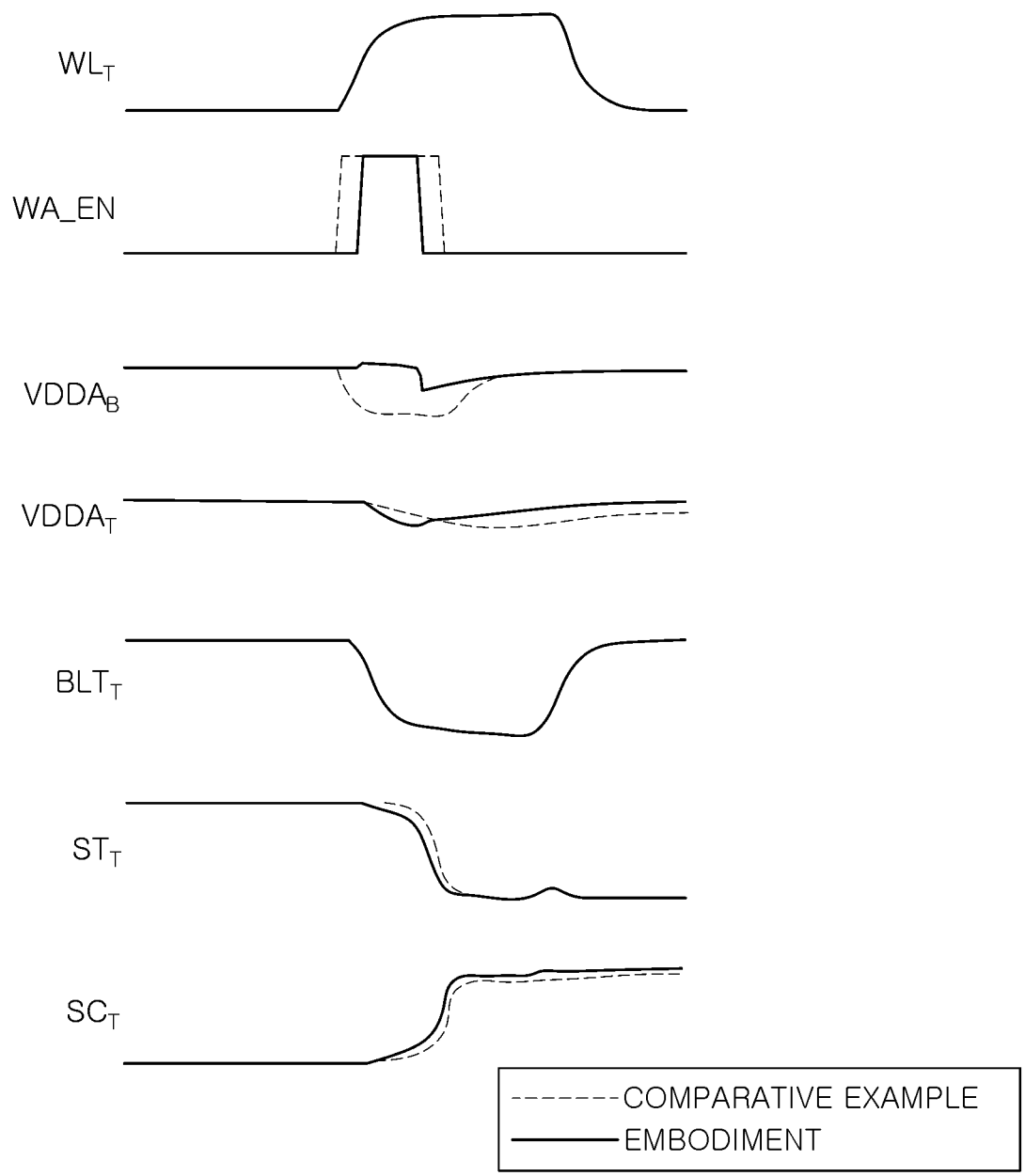
FIG. 6 is a waveform diagram illustrating a write auxiliary operation of a memory device according to some example embodiments of the present disclosure.

FIG. 5 is a diagram illustrating a memory device and a structure of a write auxiliary circuit included therein according to some example embodiments. FIG. 6 is a waveform diagram illustrating a write auxiliary operation of a memory device according to some example embodiments.

Referring to FIG. 5, a memory device 20 may correspond to the memory device 10 illustrated in FIG. 4. For example, the memory device 20 may include a bit cell array 21, a bit cell dummy array 27, a write driver 26, and a write auxiliary circuit 28 corresponding to the components of the memory device 10, respectively. The write auxiliary circuit 28 may be connected to the first auxiliary line VDDA and the second auxiliary line DVDDA.

The write auxiliary circuit 28 may be controlled by a plurality of signals (e.g., a pass-gate signal P/G, a write auxiliary enable signal WA_EN, TIE0 signal, and column signal WCOL). However, the example embodiments thereof are not limited thereto. For example, the configuration of the write auxiliary circuit 28 may be varied in various manners.

The write auxiliary circuit 28 may be electrically connected and/or blocked by a reset boosting transistor 29 connected to the first auxiliary line VDDA. For example, the reset boosting transistor 29 may delay reduction of the cell power voltages $VDDA_T$ and $VDDA_B$ supplied to the bit cells $BC_T$ and $BC_B$ during the write auxiliary operation. The reset boosting transistor 29 may improve the speed of pre-charge operation of the cell power voltages $VDDA_T$ and $VDDA_B$ after the write auxiliary operation is completed.

The write auxiliary enable signal WA_EN may be at a low level while the memory device 20 is in a ready state and/or performing a read operation. Accordingly, the first auxiliary line VDDA may be charged with the write auxiliary operation voltage VDDC through the turned-on reset boosting transistor 29. The second auxiliary line DVDDA may also be pre-charged with the write auxiliary operation voltage VDDC through the turned-on write auxiliary PMOS transistor.

When a write operation is performed, the write auxiliary enable signal WA_EN may be activated to a high level such that the write auxiliary PMOS transistor and the reset boosting transistor 29 may be turned off and the write auxiliary NMOS transistor may be turned on.

In this case, the write auxiliary circuit 28 may discharge only the cell power voltage $DVDDA_{IO}$ charged in the second auxiliary line DVDDA, and may not discharge the cell power voltage $VDDA_{IO}$ charged in the first auxiliary line VDDA. Accordingly, a write auxiliary operation may be performed sequentially from the first bit cell $BC_T$ to the second bit cell $BC_B$.

When the write auxiliary operation is completed, the write enable signal WA_EN may be inactivated (or reduced to a low level). In this case, the second auxiliary line DVDDA may be floated to maintain the level at the time of inactivation. The first auxiliary line VDDA and the second auxiliary line DVDDA may be pre-charged until the next write auxiliary operation starts.

The P/G signal may be applied to a pass-gate transistor in which the write auxiliary operation voltage VDDC is applied to a source terminal. The transistor (e.g., a PMOS transistor) to which a TIE0 signal is applied may maintain a turned-on state to further lower the discharged cell power voltage $DVDDA_{IO}$. For example, in some example embodiments, the transistor to which the TIE0 signal is applied may always maintain the turned-on state.

When the column signal WCOL is activated together with the write auxiliary enable signal WA_EN (e.g., during a write operation), a write auxiliary operation (e.g., for discharging the first auxiliary line VDDA) may be performed. Accordingly, the time required for the write operation may be reduced.

Referring to FIG. 6, the levels of signals and voltages related to the memory device 20 may change according to the write auxiliary operation of the write auxiliary circuit 28. For example, when the write auxiliary enable signal WA_EN is in an inactive state, the memory device 20 may be in a ready state and/or may perform a read operation. In these cases, the word line voltage WLT may be a low level, and the bit line voltage BLTT may be a high level.

The cell power voltages $VDDA_T$ and $VDDA_B$ supplied to the first bit cell $BC_T$ and the second bit cell $BC_B$ may be at a high level in a pre-charged state. Before the write operation is performed, data corresponding to a high level may be stored in the first output node $ST_T$ of the first bit cell $BC_T$, and data corresponding to the low level may be stored in a second output node $SC_T$.

When the write auxiliary enable signal WA_EN is activated, the write auxiliary circuit 28 may perform a write auxiliary operation for performing a write operation. For example, in the memory device (e.g., 20 of FIG. 5), the first auxiliary line VDDA may not be discharged and only the second auxiliary line DVDDA may be discharged, such that a write auxiliary operation may be performed sequentially in a direction from the first bit cell $BC_T$ to the second bit cell $BC_B$.

Thereafter, the write auxiliary enable signal WA_EN may be deactivated and the write auxiliary operation may stop. The first output node $ST_T$ of the first bit cell $BC_T$ may be changed to a low level, and the second output node $SC_T$ may be changed to a high level, such that a write operation on the first bit cell $BC_T$ may be completed.

The comparative example illustrated in FIG. 6 may illustrate a result of a write auxiliary operation in a memory device not including the second auxiliary circuit DVDDA. As a result of the write auxiliary operation in the memory device 20, the time taken to perform the write auxiliary operation may be reduced as compared to the result of the write auxiliary operation in the memory device in the comparative example. That is, the time for which the write auxiliary enable signal WA_EN is activated may be reduced.

As the write auxiliary operation is preferentially performed on the first bit cell $BC_T$, the start time of the write auxiliary operation on the first bit cell $BC_T$ may become earlier. The target voltage by the write auxiliary operation may be determined based on the cell power voltage $VDDA_T$ supplied to the first bit cell $BC_T$. Accordingly, differently from the memory device in the comparative example in which the cell power voltage $VDDA_B$ supplied to the second bit cell $BC_B$ is smaller than the cell power voltage $VDDA_T$ supplied to the first bit cell $BC_T$, the memory device 20 may reduce the reduction level of the cell power voltage $VDDA_B$ supplied to the second bit cell $BC_B$.

Also, the memory device 20 may improve the speed of write operation of the plurality of bit cells $BC_T$ and $BC_B$ based on the differences described above.

Figure 7A:
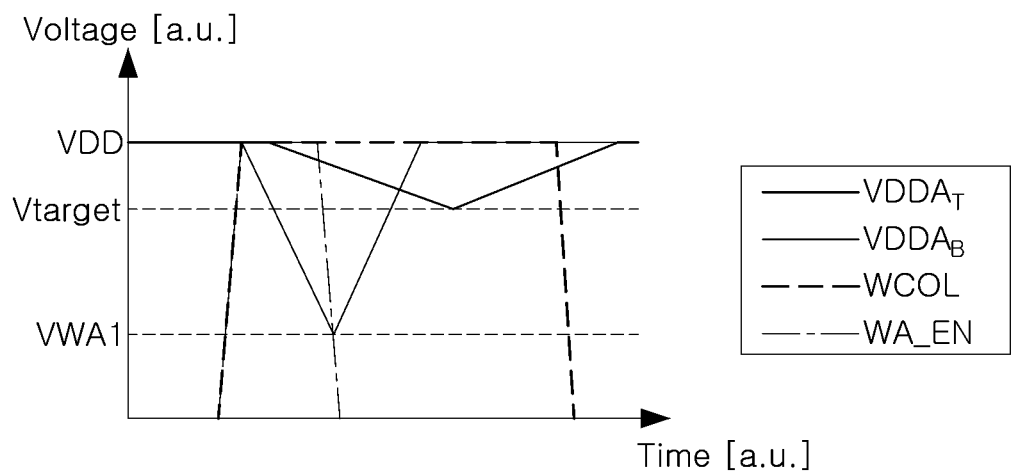
FIGS. 7A and 7B are diagrams illustrating changes in cell power voltage according to a write auxiliary operation of a memory device according to a comparative example of the present disclosure.
Figure 7B:
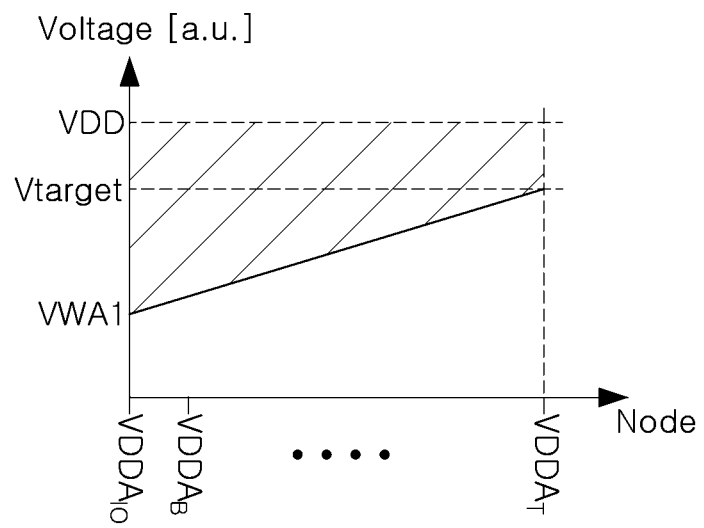
Figure 8A:
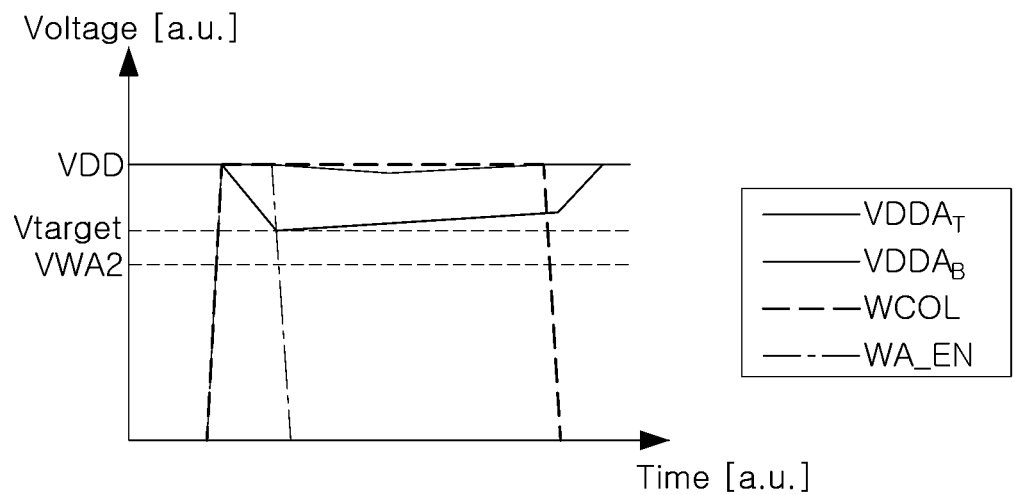
FIGS. 8A and 8B are diagrams illustrating changes in cell power voltage according to a write auxiliary operation of a memory device according to some example embodiments of the present disclosure.
Figure 8B:
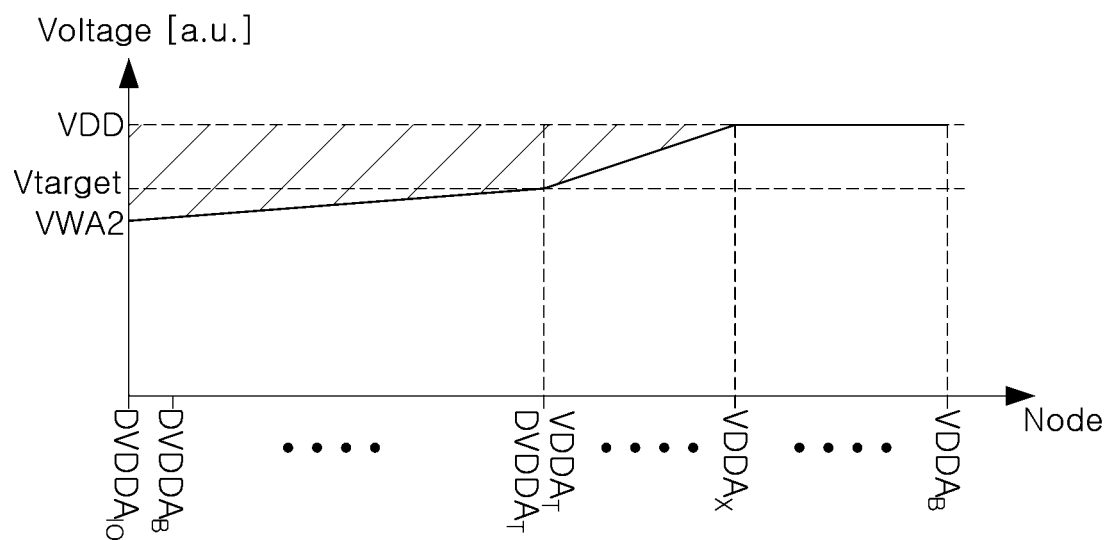

FIGS. 7A and 7B are diagrams illustrating changes in cell power voltage according to a write auxiliary operation of a memory device according to a comparative example. FIGS. 8A and 8B are diagrams illustrating changes in cell power voltage according to a write auxiliary operation of a memory device according to some example embodiments.

Referring to FIG. 7A, the memory device in the comparative example may perform a write auxiliary operation when the write auxiliary enable signal WA_EN is activated. In this case, the column signal WCOL may be in an activated state.

The write auxiliary circuit may perform an auxiliary write operation in which a level of the cell power voltage $VDDA_T$ supplied to the first bit cell $BC_T$ disposed to be spaced apart from the write driver among the plurality of bit cells is lowered to the level of the target voltage Vtarget during a write operation. To apply the target voltage Vtarget to the first bit cell $BC_T$, the write auxiliary circuit may need to output the first write auxiliary voltage VWA1 as the cell power voltage $VDDA_{IO}$.

Referring to FIGS. 7A and 7B together, since the memory device in the comparative example performs a write auxiliary operation sequentially in the direction from the second bit cell $BC_B$ to the first bit cell $BC_T$, the cell power voltage $VDDA_T$ supplied to the first bit cell $BC_T$ may be greater than the cell power voltage $VDDA_B$ supplied to the second bit cell $BC_B$. Also, the time point at which the cell power voltage $VDDA_T$ applied to the first bit cell $BC_T$ becomes the minimum may be after the time point at which the cell power voltage $VDDA_B$ applied to the second bit cell $BC_B$ becomes the minimum.

Referring to FIG. 8A, the memory device 10 may perform a write auxiliary operation when the write auxiliary enable signal WA_EN is activated. In this case, the column signal WCOL may be in an activated state.

The write auxiliary circuit may perform an auxiliary write operation in which a level of the cell power voltage $VDDA_T$ supplied to the first bit cell $BC_T$ disposed to be spaced apart from the write driver among the plurality of bit cells is lowered to the level of the target voltage Vtarget during a write operation. To apply the target voltage Vtarget to the first bit cell $BC_T$, the write auxiliary circuit may need to output the second write auxiliary voltage VWA2 as the cell power voltage $VDDA_{IO}$. For example, the second write auxiliary voltage VWA2 may be greater than the first write auxiliary voltage VWA1.

Referring to FIGS. 8A and 8B together, the memory device 10 may perform a write auxiliary operation sequentially from the first bit cell $BC_T$ to the second bit cell $BC_B$ such that the cell power voltage $VDDA_T$ supplied to the first bit cell $BC_T$ may be less than the cell power voltage $VDDA_B$ supplied to the second bit cell $BC_B$. Also, the time point at which the cell power voltage $VDDA_T$ applied to the first bit cell $BC_T$ becomes the minimum may be before the time point at which the cell power voltage $VDDA_B$ applied to the second bit cell $BC_B$ becomes the minimum.

Additionally, the effect of the write auxiliary operation by the write auxiliary circuit may not be applied to the cell power voltage $VDDA_B$ supplied to the second bit cell $BC_B$. For example, the write auxiliary circuit may perform the write auxiliary operation on only a portion of the plurality of bit cells. For example, the cell power voltages $VDDA_B$, . . ., $VDDA_X$ supplied between the second bit cell $BC_B$ and the third bit cell disposed at a distance from the second bit cell $BC_B$ may have the level of the driving voltage VDD to which the effect of the write auxiliary operation is not applied.

Accordingly, in the memory device 10, by applying the second auxiliary line together with the first auxiliary line, the time point at which the cell power voltage $VDDA_T$ supplied to the first bit cell $BC_T$ decrease may occur earlier than the comparative example, and the cell power voltage $VDDA_T$ may be considered to swiftly reach the target voltage Vtarget. Accordingly, write performance for all of the plurality of bit cells may improve.

Figure 9:
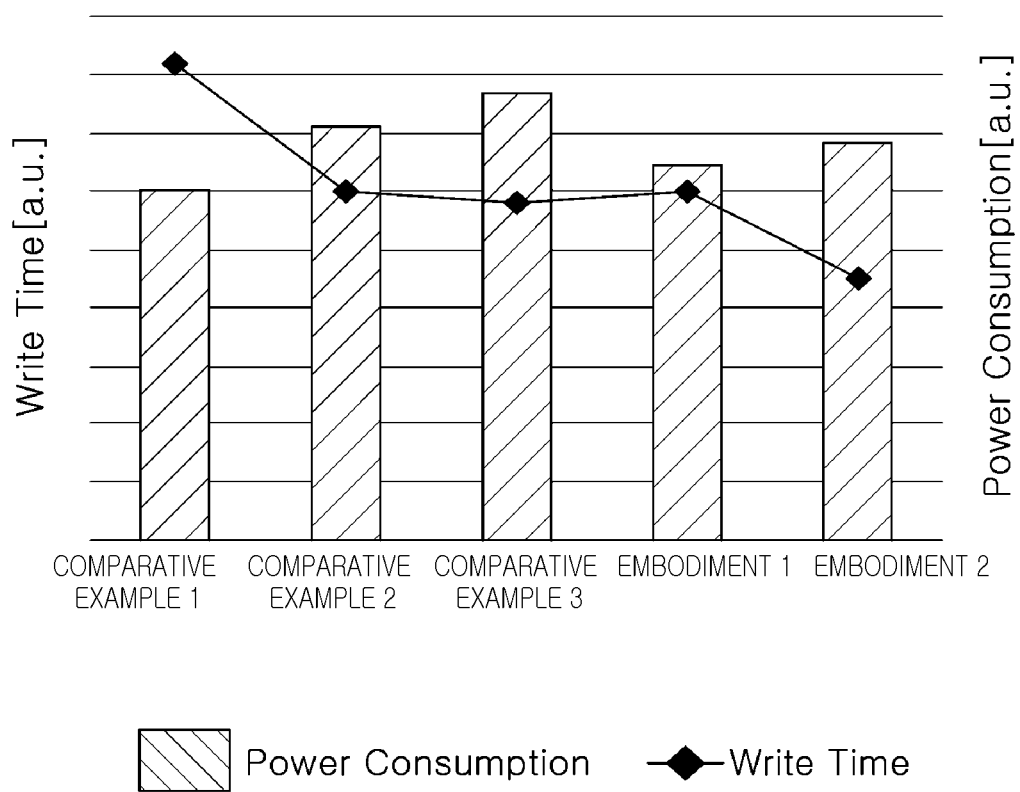
FIG. 9 is a diagram illustrating an effect of a memory device according to some example embodiments of the present disclosure compared to some comparative examples.

FIG. 9 is a diagram illustrating an effect of a memory device according to some example embodiments of the present disclosure compared to some comparative examples.

Referring to FIG. 9, the memory device 10 may, by applying the second auxiliary line DVDDA together with the first auxiliary line VDDA, reduce the time required for a write operation, and/or the power consumed in the write operation.

In Comparative Example 1, a write auxiliary circuit is not applied, and in Comparative Examples 2 and 3, a write auxiliary circuit to which only the first auxiliary line VDDA is connected may be applied. In Embodiments 1 and 2, a write auxiliary circuit in which the first auxiliary line VDDA and also the second auxiliary line DVDDA are connected may be applied.

In Comparative Example 2 and Embodiment 1, the target voltage Vtarget may be 90% of the driving voltage VDD. In Comparative Example 3 and Embodiment 2, the target voltage Vtarget may correspond to 85% of the voltage VDD. For example, as the target voltage Vtarget is lower, power consumed in a write operation may increase and time required for a write operation may decrease.

As compared to Comparative Example 1, time required for a write operation and power consumed in a write operation may be reduced in both Comparative Examples and Embodiments to which the write auxiliary circuit is applied.

Particularly, when a write auxiliary circuit connected only to the first auxiliary line VDDA is applied, the time required for the write operation may not decrease to a level below a predetermined (other otherwise determined) level even when the target voltage Vtarget decreases due to, e.g., an RC delay and/or the like. When a write auxiliary circuit in which the second auxiliary line DVDDA is also connected is applied, the time required for the write operation may improve as the target voltage Vtarget is lower than the driving voltage VDD.

Also, as compared to the example in which only the first auxiliary line VDDA is connected is applied, when the write auxiliary circuit in which the second auxiliary line DVDDA is connected is applied, the power consumed in the write operation may be further reduced.

Figure 10:
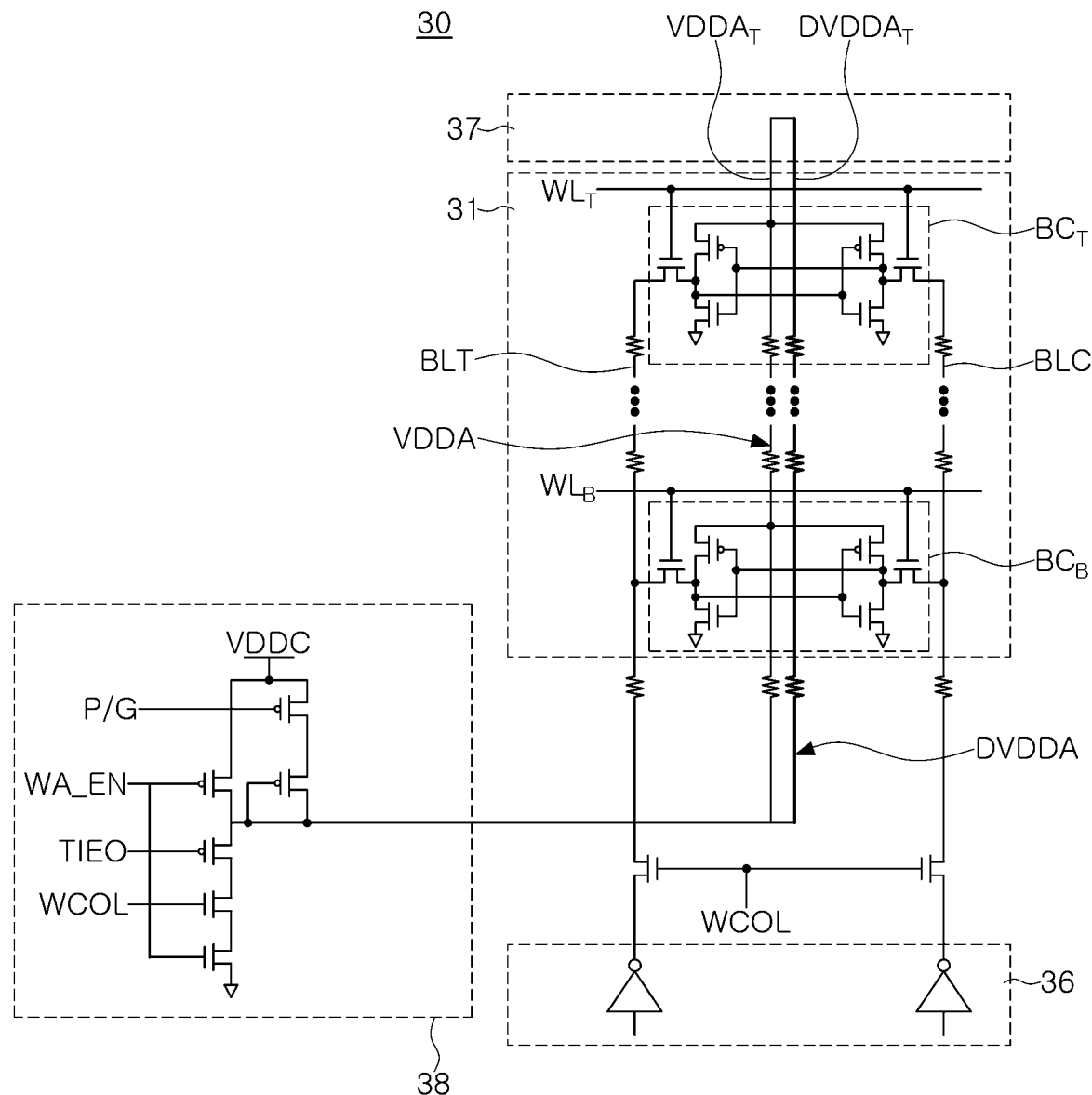
FIG. 10 is a diagram illustrating a memory device and a structure of a write auxiliary circuit included therein according to some example embodiments of the present disclosure.

FIG. 10 is a diagram illustrating a memory device and a structure of a write auxiliary circuit included therein according to some example embodiments.

Referring to FIG. 10, a memory device 30 may correspond to the memory device 10 illustrated in FIG. 4. For example, the memory device 30 may include a write auxiliary circuit 38 similar to the write auxiliary circuit 28 of FIG. 5, but which omits the reset boosting transistor (29 of FIG. 5). For example, the write auxiliary circuit 38 may perform a write auxiliary operation using a write auxiliary circuit 38 not including a reset boosting transistor. Even when the write auxiliary circuit 38 does not include a reset boosting transistor, the memory device 30 may have an effect similar to that of the memory device 20 illustrated in FIG. 5.

The other components of the memory device 30 other than the write auxiliary circuit 38 may correspond to the components included in the memory device 20 illustrated in FIG. 5. For example, the memory device 30 may include a bit cell array 31, a bit cell dummy array 37, and a write driver 36 corresponding to the components of the memory device 20, respectively. The write auxiliary circuit 38 may be connected to the first auxiliary line VDDA and the second auxiliary line DVDDA.

In the memory device 30, both ends of the first auxiliary line VDDA and the second auxiliary line DVDDA may be connected to each other. The second auxiliary line DVDDA may have a width greater than that of the first auxiliary line VDDA and may include a metal line not directly connected to the plurality of bit cells $BC_T$ and $BC_B$. Accordingly, resistance of the second auxiliary line DVDDA may be smaller than resistance of the first auxiliary line VDDA.

As noted above, the memory device 30 may not include a reset boosting transistor electrically blocking the first auxiliary line VDDA and the write auxiliary circuit 38. Nevertheless, when the cell power voltage $DVDDA_{IO}$ is discharged through the first auxiliary line VDDA and the second auxiliary line DVDDA (having both ends connected to each other), the discharged signal may be mostly transmitted to the first auxiliary line VDDA through the second auxiliary line DVDDA.

Figure 11:
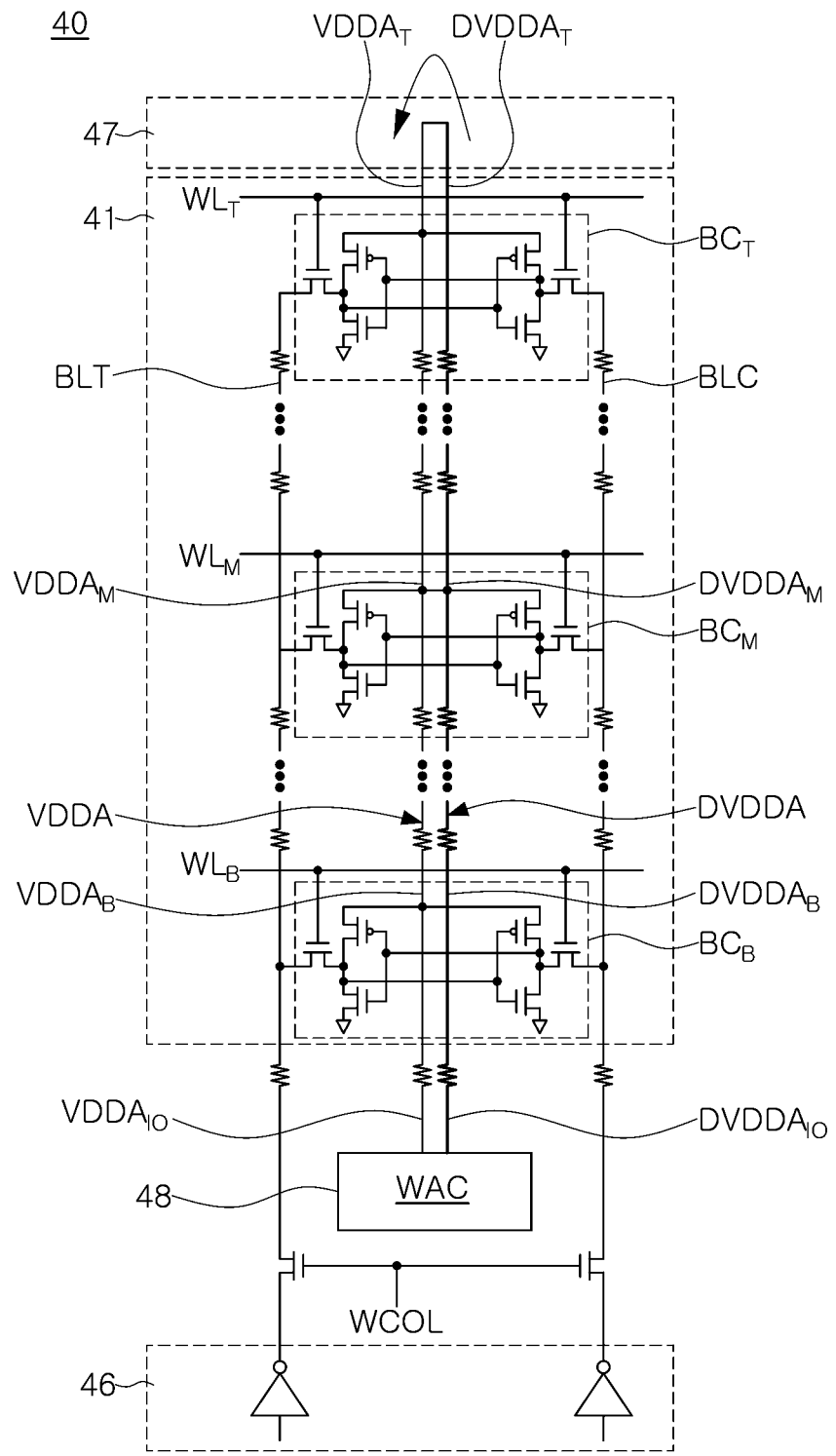
FIG. 11 is a diagram illustrating a structure of a memory device according to some example embodiments of the present disclosure.

FIG. 11 is a diagram illustrating a structure of a memory device according to some example embodiments.

Referring to FIG. 11, in a memory device 40, a second auxiliary line DVDDA may be connected to at least one of a plurality of bit cells $BC_T$, $BC_M$, and $BC_B$.

For example, the memory device 40 in FIG. 11 may be connected to the third bit cell $BC_M$ on which the second auxiliary line DVDDA is disposed in a central region thereof, but the example embodiments thereof are not limited thereto. For example, the second auxiliary line DVDDA may be connected to the first bit cell $BC_T$ and/or the second bit cell $BC_B$ rather than the third bit cell $BC_M$. Also, the second auxiliary line DVDDA may be connected to two or more of the plurality of bit cells $BC_T$, $BC_M$, and $BC_B$ arranged in a column direction.

The components of the memory device 40 other than the connection structure of the second auxiliary line DVDDA may correspond to the components included in the memory device 10 illustrated in FIG. 4. For example, the memory device 40 may include a bit cell array 41, a bit cell dummy array 47, a write driver 46, and a write auxiliary circuit 48 corresponding to the components of the memory device 10, respectively. The write auxiliary circuit 48 may be connected to the first auxiliary line VDDA and the second auxiliary line DVDDA.

By changing the connection structure of the second auxiliary line DVDDA in the memory device 40, a level of resistance of the first auxiliary line VDDA and the second auxiliary line DVDDA may decrease.

For example, the memory device 40 may not perform the write auxiliary operation from the bit cell spaced apart from the write driver 46 sequentially, but may connect the second auxiliary line DVDDA to one of the plurality of bit cells $BC_T$, $BC_M$, and $BC_B$, such that a level of overall resistance of the auxiliary line may be reduced. Accordingly, the memory device 40 may reduce power consumption when a write auxiliary operation is performed.

Figure 12:
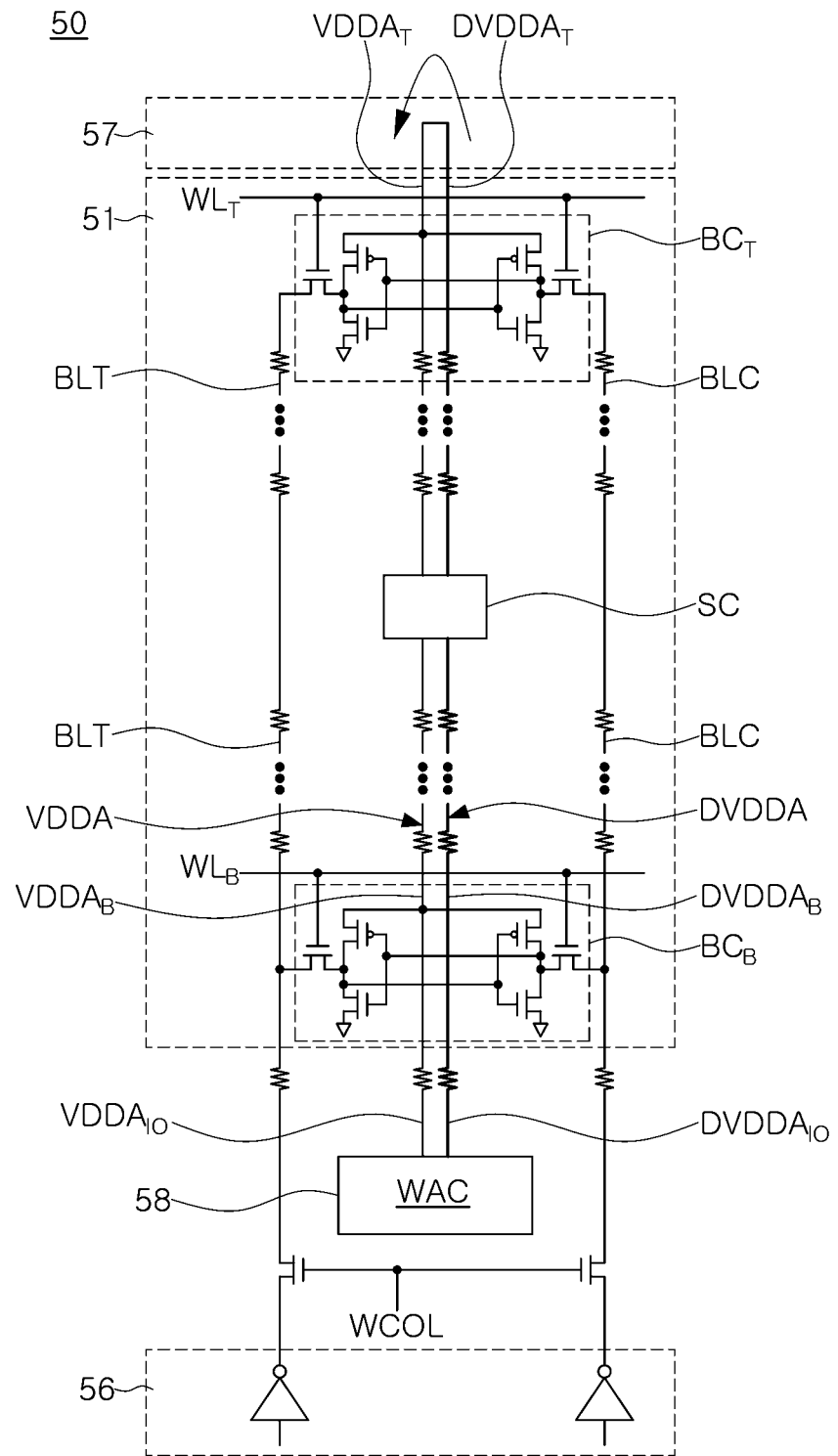
FIG. 12 is a diagram illustrating a structure of a memory device according to some example embodiments of the present disclosure.

FIG. 12 is a diagram illustrating a structure of a memory device according to some example embodiments.

Referring to FIG. 12, the bit cell array 51 of the memory device 50 may further include at least one strap cell SC disposed between the bit cells $BC_T$ and $BC_B$ arranged in a column direction among the plurality of bit cells $BC_T$ and $BC_B$. The first auxiliary line VDDA and the second auxiliary line DVDDA may be connected to each other through the at least one strap cell SC.

For example, in the memory device 50 in FIG. 12, the second auxiliary line DVDDA may be connected to the first auxiliary line VDDA through a single strap cell SC, but the example embodiments thereof are not limited thereto. For example, the second auxiliary line DVDDA may be connected to the first auxiliary line VDDA through two or more strap cells SC disposed between the plurality of bit cells $BC_T$ and $BC_B$.

The components of the memory device 50, other than the strap cell SC, may correspond to the components included in the memory device 10 illustrated in FIG. 4. For example, the memory device 40 may include a bit cell array 51, a bit cell dummy array 57, a write driver 56, and a write auxiliary circuit 58 corresponding to the components of the memory device 10, respectively. The write auxiliary circuit 58 may be connected to the first auxiliary line VDDA and the second auxiliary line DVDDA.

By connecting the first auxiliary line VDDA to the second auxiliary line DVDDA through the strap cell SC in the memory device 50, a level of overall resistance of the first auxiliary line VDDA and the second auxiliary line DVDDA may be reduced. For example, the memory device 50 may not perform the write auxiliary operation sequentially from the bit cell spaced apart from the write driver 56, but may reduce a level of overall resistance of the auxiliary line, such that power consumption may be reduced when the write auxiliary operation is not performed.

Figure 15:
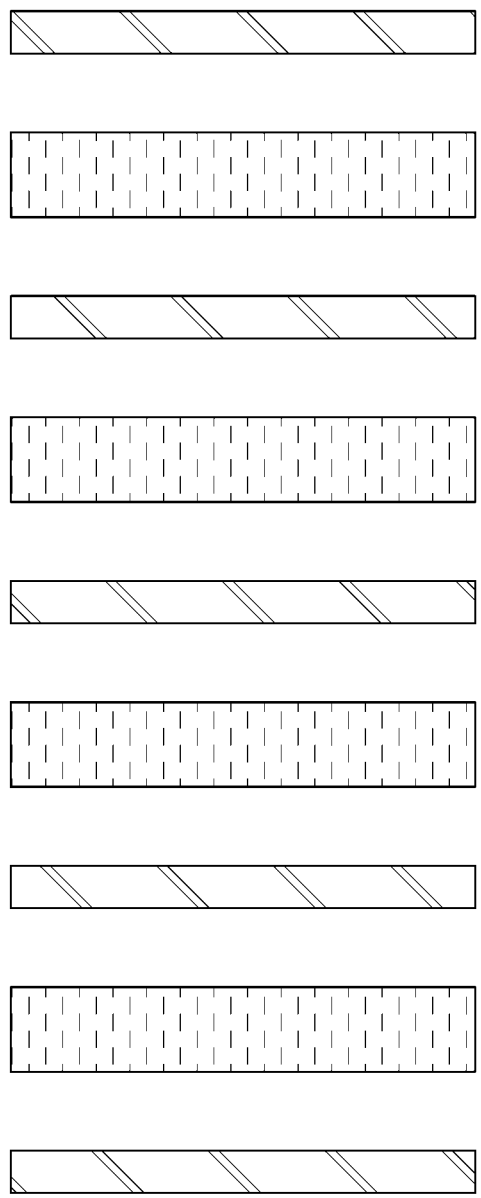
Figure 16:
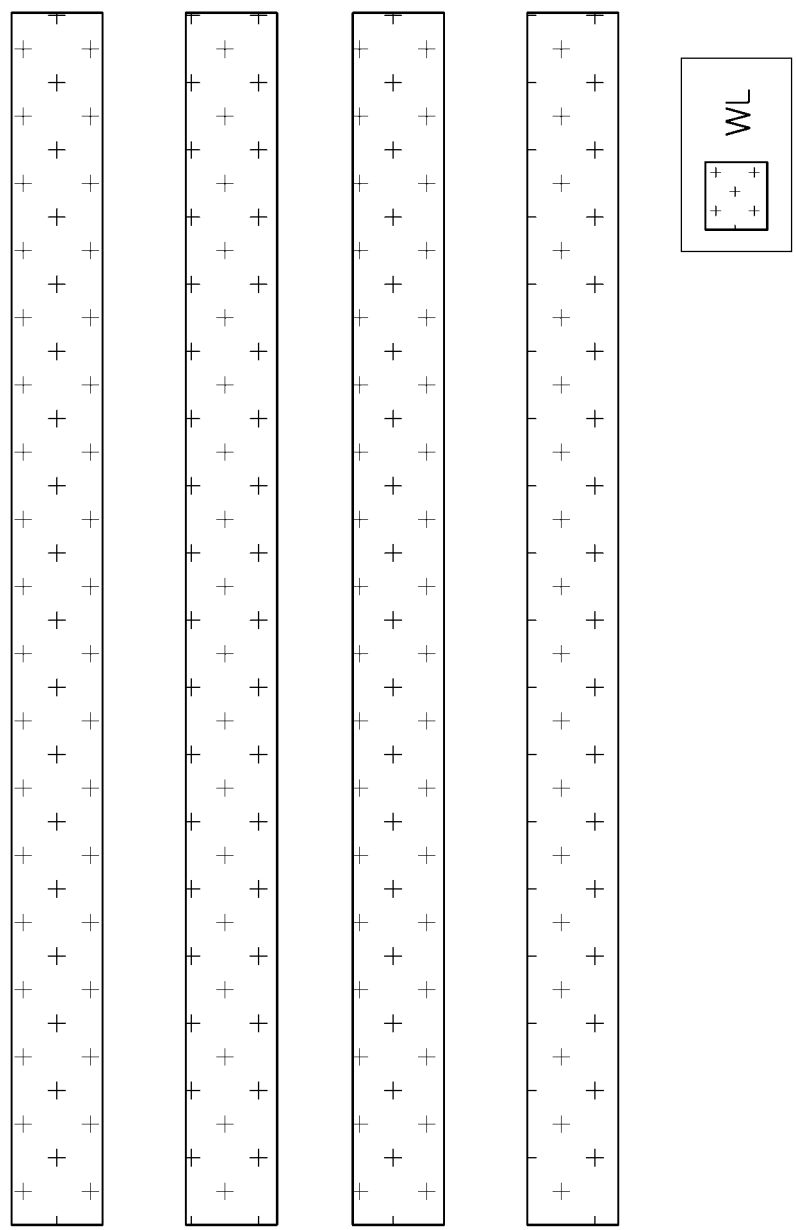
Figure 17:
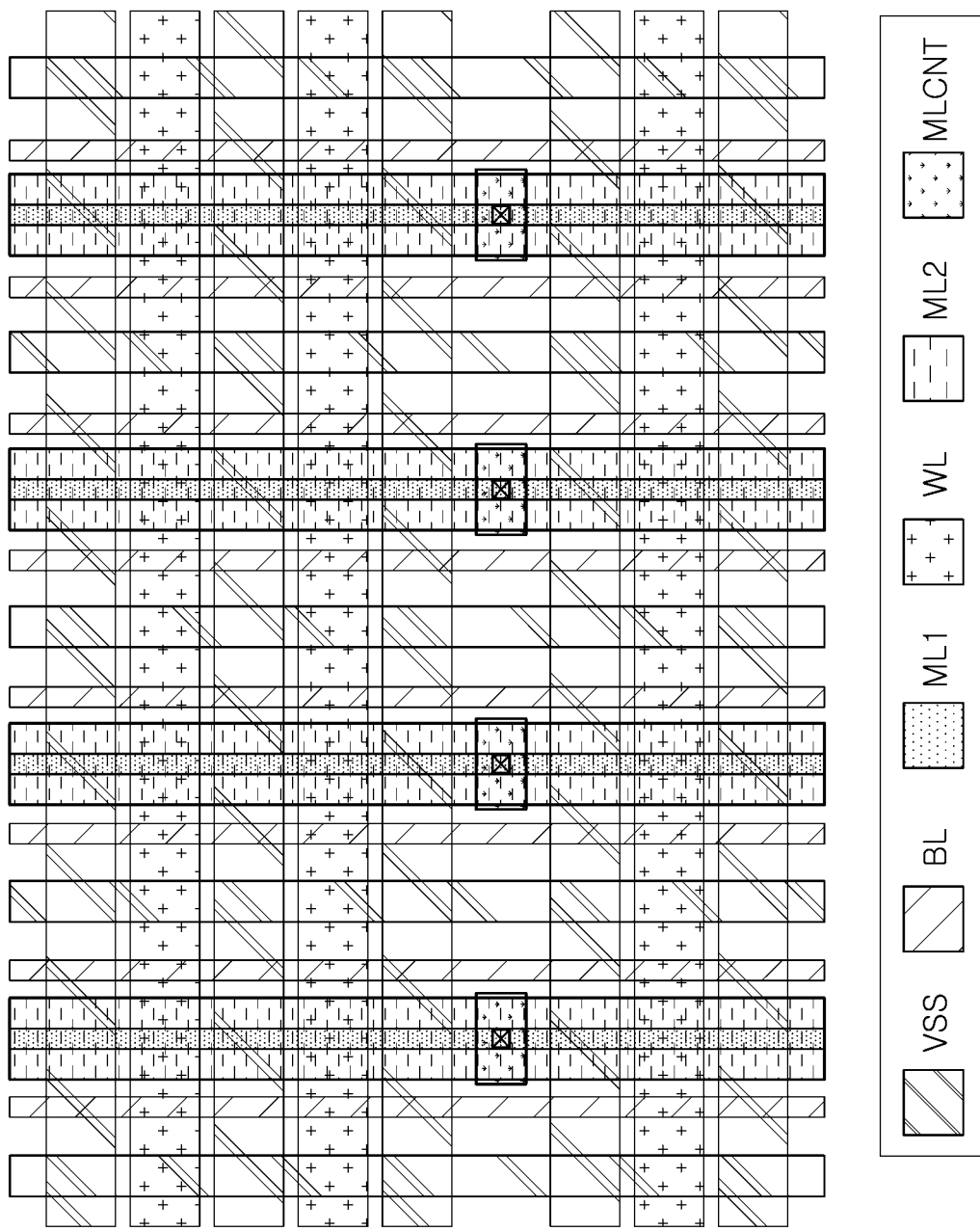
FIG. 17 is a diagram illustrating a layout of a memory device on a bit cell dummy array according to some example embodiments of the present disclosure.

FIGS. 13 to 16 are diagrams illustrating a layout of a memory device on a bit cell array according to some example embodiments. FIG. 17 is a diagram illustrating a layout of a memory device on a bit cell dummy array according to some example embodiments.

Referring to FIGS. 13 to 16, for convenience of description, a memory device is described as corresponding to the memory device 10 illustrated in FIG. 4. For example, the bit cell array 11 of the memory device 10 may include a plurality of bit cells $BC_T$ and $BC_B$ arranged in row and column directions. However, the example embodiments thereof are not limited thereto, and the memory device may be any of the memory devices described above.

Figure 13:
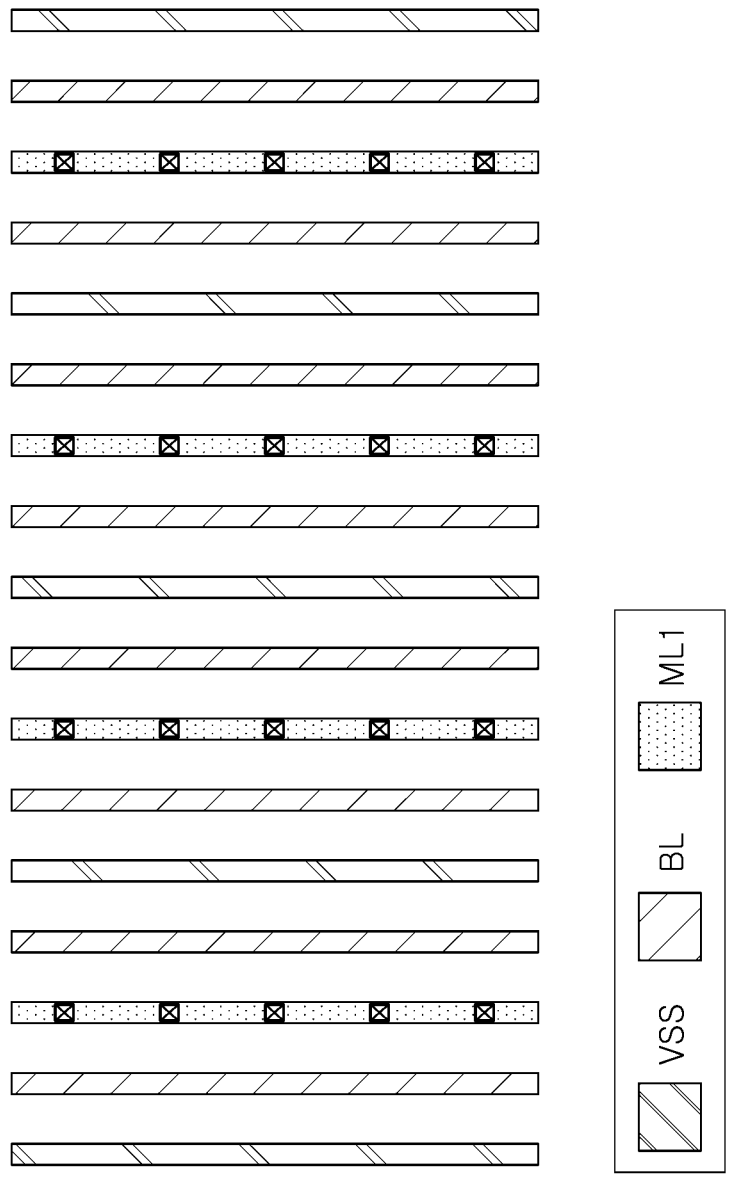
FIGS. 13 to 16 are diagrams illustrating a layout of a memory device on a bit cell array according to some example embodiments of the present disclosure.
Figure 14:
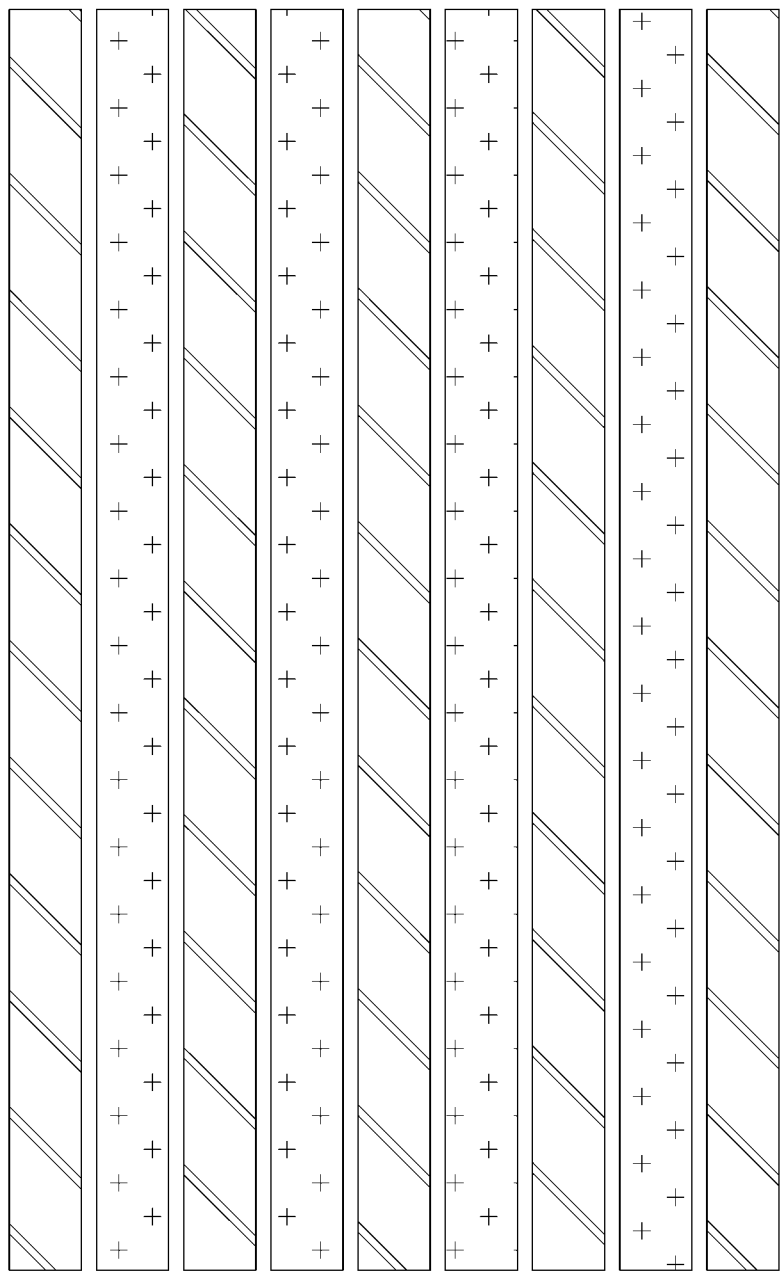

FIG. 13 illustrates a layout of a first layer disposed on the bit cell array 11 of the memory device 10, such as, for example, a lower auxiliary line layer, and FIG. 14 illustrates a layout of a second layer disposed on the first layer, such as, for example, a word line layer. FIG. 15 illustrates a layout of a third layer disposed on the second layer, such as, for example, an upper auxiliary line layer. FIG. 16 illustrates a layout of wiring layers disposed on the bit cell dummy array 17 disposed on one side of the bit cell array 11.

However, the layouts illustrated in FIGS. 13 to 16 are merely examples and the example embodiments thereof are not limited thereto. For example, the arrangement and shape of wirings illustrated in each of the layouts may vary depending on example embodiments. Also, the layouts illustrated in FIGS. 13 to 16 illustrate only the vias related to the first auxiliary lines ML1 and the second auxiliary lines ML2 and the connection structure of the other wirings may not be provided.

Referring to FIG. 13, a plurality of bit lines BL, a plurality of ground lines VSS, and a plurality of first auxiliary lines ML1 extending in the column direction may be formed on the lower auxiliary line layer. For example, each of the plurality of first auxiliary lines ML1 may correspond to a plurality of bit cells arranged in one column direction.

The plurality of first auxiliary lines ML1 may correspond to the first auxiliary line VDDA illustrated in FIG. 4. The plurality of first auxiliary lines ML1 may apply a cell power voltage to the plurality of bit cells.

Referring to FIG. 14, a plurality of word lines WL and a plurality of ground lines VSS extending in a row direction may be formed on the word line layer. For example, the plurality of ground lines VSS may be connected to the plurality of ground lines VSS formed on the lower auxiliary line layer. However, an example embodiment thereof is not limited thereto.

Referring to FIG. 15, a plurality of ground lines VSS and a plurality of second auxiliary lines ML2 extending in a column direction may be formed on the upper auxiliary line layer. For example, the plurality of second auxiliary lines ML2 may correspond to the plurality of first auxiliary lines ML1, respectively. The plurality of second auxiliary lines ML2 and the plurality of first auxiliary lines ML1 may be formed to overlap each other in a direction perpendicular to the bit cell array 11. However, the example embodiments thereof are not limited thereto. For example, the plurality of second auxiliary lines ML2 and the plurality of first auxiliary lines ML1 may be formed on layers having different heights and may extend in parallel in the column direction.

The plurality of second auxiliary lines ML2 may not be directly connected to other wirings including the plurality of first auxiliary lines ML1 on the bit cell array 11. One end of the plurality of second auxiliary lines ML2 may be connected to a write auxiliary circuit, and the other end of the plurality of second auxiliary lines ML2 may extend to the bit cell dummy array 17. Also, the plurality of ground lines VSS may be connected to the plurality of ground lines VSS formed on the first layer and/or the second layer. However, the example embodiments thereof are not limited thereto.

Referring to FIGS. 13 to 16, the plurality of word lines may be disposed on the word line layer between the lower auxiliary line layer and the upper auxiliary line layer, but the example embodiments thereof are not limited thereto. For example, another word line layer in which a plurality of word lines extending in a row direction may be formed and/or disposed on the upper auxiliary line layer. For example, the plurality of word lines disposed on the upper auxiliary line layer may be connected to the plurality of word lines WL formed on a word line layer disposed below an upper auxiliary line layer through a plurality of word line contacts formed on the upper auxiliary line layer.

Referring to FIG. 17, in the bit cell dummy array 17 included in the semiconductor device, the other ends of the plurality of second auxiliary lines ML2 may be connected to a plurality of first auxiliary lines ML1, e.g., through an auxiliary line contact MLCNT.

The cell power voltage output by the write auxiliary circuit may be transferred to the plurality of first auxiliary lines ML1 through the plurality of second auxiliary lines ML2. Accordingly, the direction in which the cell power voltage is applied to the plurality of bit cells may be opposite to the direction in which the bit line voltage is applied to the plurality of bit lines BL.

The plurality of second auxiliary lines ML2 may be wirings formed above the plurality of first auxiliary lines ML1. Accordingly, the plurality of second auxiliary lines ML2 may have a width greater than a width of the plurality of first auxiliary lines ML1. For example, the first auxiliary lines ML1 may have a width of about 16 nm to 20 nm, and the second auxiliary lines ML2 may have a width of about 37 nm to 45 nm. However, an example embodiment thereof is not limited thereto.

Accordingly, resistance of the plurality of second auxiliary lines ML2 may be smaller than resistance of the plurality of first auxiliary lines ML1. Also, the plurality of second auxiliary lines ML2 may have capacitance smaller than capacitance of the plurality of first auxiliary lines ML1. Accordingly, the memory device 10 in an example embodiment may further reduce power consumption when a write auxiliary operation is reduced.

Figure 18:
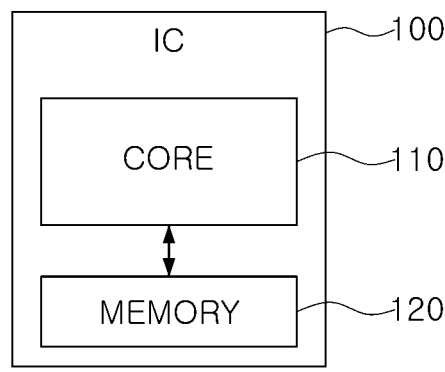
FIG. 18 is a block diagram illustrating an integrated circuit including a memory device according to some example embodiments of the present disclosure.

FIG. 18 is a block diagram illustrating an integrated circuit (IC) including a memory device according to some example embodiments.

Referring to FIG. 18, an integrated circuit (IC) 100 may include a core 110 and a memory device 120. For example, the integrated circuit 100 may be implemented as at least one of an application processor (AP), a microprocessor, a central processing unit (CPU), an ASIC, and/or a device similar thereto.

The core 110 may be configured as a logic core performing a logic operation, and/or a processor core fetching an instruction and/or data and processing the fetched instruction or data. The core 110 may use the memory device 120 as a cache memory. For example, the core 110 may temporarily store instructions or data provided from an external memory device in the memory device 120.

The memory device 120 may be a memory device according to the example embodiments described with reference to FIGS. 1 to 17 and may reduce the cell power voltage level of the bit cells during a write operation using the write auxiliary circuit. The memory device 120 may preferentially supply the cell power voltage having a reduced level to the bit cell disposed to be spaced apart from the write driver through the second auxiliary line connected to the write auxiliary circuit. Accordingly, the memory device 120 may swiftly perform a write operation on the plurality of bit cells with low power consumption.

Figure 19:
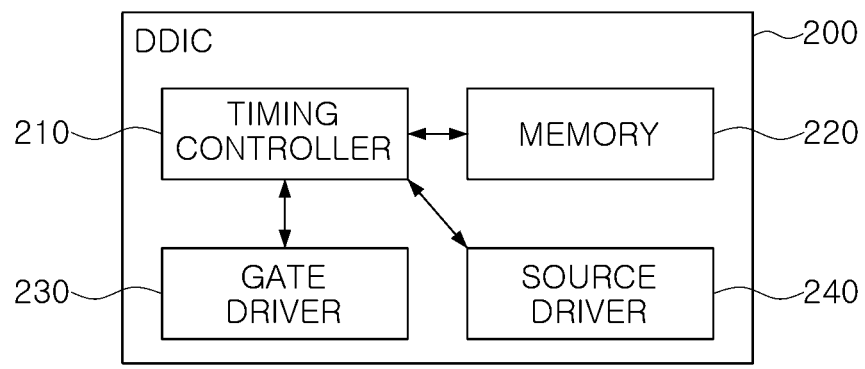
FIG. 19 is a block diagram illustrating a display driver integrated circuit including a memory device according to some example embodiments of the present disclosure.

FIG. 19 is a block diagram illustrating a display driver integrated circuit (DDIC) including a memory device according to some example embodiments.

Referring to FIG. 19, a display driver integrated circuit (DDIC) 200 may include a timing controller 210, a memory device 220, a gate driver 230, and a source driver 240.

The timing controller 210 may control operations of the gate driver 230 and the source driver 240 in response to a timing signal received from an external host. The memory device 220 may be a memory device according to the example embodiments described with reference to FIGS. 1 to 17, and may store image data provided from an external host in units of frames or lines.

The gate driver 230 may turn on pixel transistors included in a display panel, such as, for example, thin-film transistors (TFTs), and the source driver 240 may apply a data voltage to pixels included in the display panel based on the image data stored in the memory device 220.

The memory device 220 may reduce the level of the cell power voltage of the bit cells during a write operation using the write auxiliary circuit. For example, the memory device 120 may preferentially supply the cell power voltage having a reduced level to the bit cell spaced apart from the write driver through the second auxiliary line connected to the write auxiliary circuit. Accordingly, the memory device 120 may swiftly perform a write operation on the plurality of bit cells with low power consumption.

Figure 20:
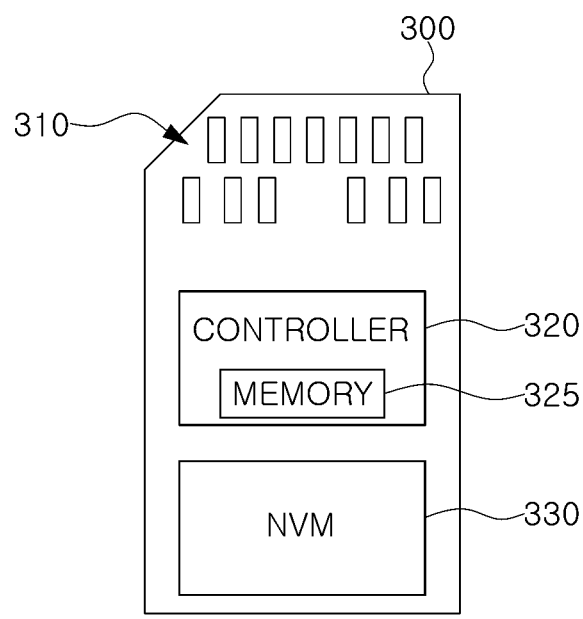
FIG. 20 is a diagram illustrating an example in which a memory device is applied to a memory card according to some example embodiments of the present disclosure.

FIG. 20 is a diagram illustrating an example in which a memory device is applied to a memory card according to an example embodiment.

Referring to FIG. 20, the memory card 300 may include a plurality of connection pins 310, a controller 320, a memory device 325, and a nonvolatile memory device 330. For example, the memory card 300 may be implemented as a memory card such as a multimedia card (MMC), a secure digital (SD) card, a micro SD card, a memory stick, an ID card, a personal computer memory card international association (PCMCIA) card, a chip card, a USB card, a smartcard, a CF card, an embedded multimedia card (eMMC), a hybrid embedded multimedia card (hybrid eMMC), and/or the like.

A plurality of connection pins 310 may be connected to an external host such that signals between the external host and the memory card 300 may be transmitted and received. The plurality of connection pins 310 may include a clock pin, a command pin, a data pin, and/or a reset pin. For example, the memory card 300 may be mounted on a computing system such as a mobile phone, a smartphone, a PDA, a PMP, a digital camera, a music player, a portable game console, a navigation system, a personal computer (PC), a server computer, a workstation, a laptop computer, a digital TV, a set-top box, and/or the like.

The controller 320 may receive data from an external host and may control the nonvolatile memory device 330 to store the received data in the nonvolatile memory device 330. Also, the controller 320 may control the nonvolatile memory device 330 to provide data stored in the nonvolatile memory device 330 to an external host. The controller 320 may include the memory device 325 as a buffer memory for temporarily storing data transmitted/received between the external host and the nonvolatile memory device 330. For example, the memory device 325 may be a memory device according to the example embodiments described with reference to FIGS. 1 to 17. The memory device 325 may store an address translation table for block management of the nonvolatile memory device 330.

The memory device 325 may reduce a cell power voltage level of the bit cells during a write operation using the write auxiliary circuit. For example, the memory device 120 may preferentially supply the cell power voltage having a reduced level to the bit cell disposed to be spaced apart from the write driver through the second auxiliary line connected to the write auxiliary circuit. Accordingly, the memory device 120 may swiftly perform a write operation on the plurality of bit cells with low power consumption.

Figure 21:
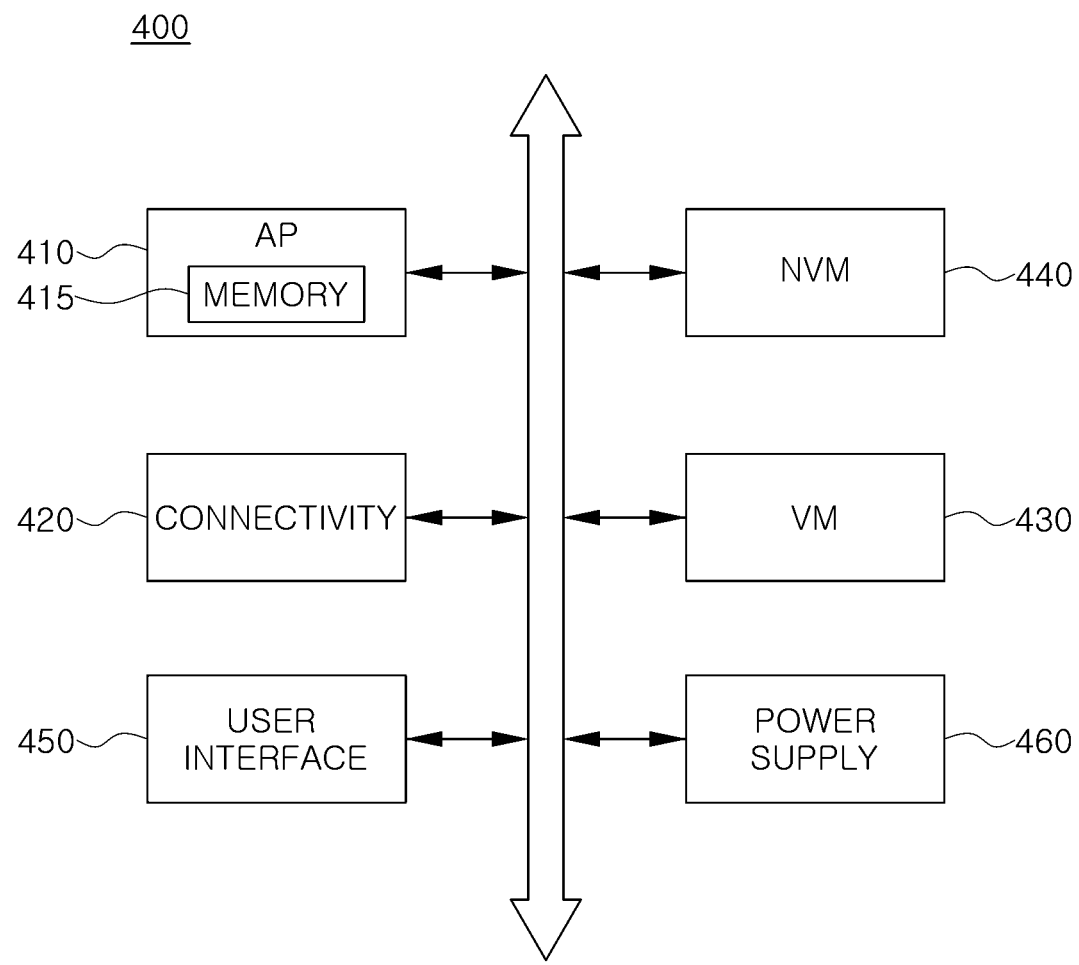
FIG. 21 is a diagram illustrating an example in which a memory device is applied to a mobile system according to some example embodiments of the present disclosure.

FIG. 21 is a diagram illustrating an example in which a memory device is applied to a mobile system according to some example embodiments.

Referring to FIG. 21, the mobile system 400 may include an application processor 410, a connection unit 420, a volatile memory device 430, a nonvolatile memory device 440, a user interface 450, and a power supply unit 460. For example, mobile system 400 may be implemented as (and/or in) a mobile system, such as a cell phone, smart phone, PDA, PMP, digital camera, music player, portable game console, navigation, and/or the like.

The application processor 410 may execute applications providing an Internet browser, a game, a video, and/or the like. The application processor 410 may include the memory device 415 as a cache memory for temporarily storing instructions or data stored in the volatile memory device 430 or the nonvolatile memory device 440. For example, the memory device 415 may be a memory device according to the example embodiment described with reference to FIGS. 1 to 17.

The memory device 415 may reduce the cell power voltage level of the bit cells during a write operation using the write auxiliary circuit. For example, the memory device 120 may preferentially supply the cell power voltage having a reduced level to the bit cell disposed to be spaced apart from the write driver through the second auxiliary line connected to the write auxiliary circuit. Accordingly, the memory device 120 may swiftly perform a write operation on the plurality of bit cells with low power consumption.

The connection unit 420 may communicate with an external device. For example, the connection unit 420 may perform USB communication, Ethernet communication, near field communication (NFC), radio frequency identification (RFID) communication, mobile communication, memory card communication, or the like.

The volatile memory device 430 may store data processed by the application processor 410 or may operate as an operation memory. For example, the volatile memory device 430 may be implemented as DRAM, SRAM, mobile DRAM, and/or a similar memory.

The non-volatile memory device 440 may store a boot image for booting the mobile system 400. For example, the nonvolatile memory device 440 may be implemented as an electrically erasable programmable read only memory (EEPROM), flash memory, phase change RAM (PRAM), resistance RAM (RRAM), nano floating gate memory (NFGM), polymer RAM (PoRAM), magnetic RAM (MRAM), ferroelectric RAM (FRAM), or similar memory.

User interface 450 may include one or more input devices, such as a keypad, a touch screen, and/or one or more output devices, such as speakers, display devices. The power supply 460 may supply an operating voltage of the mobile system 400. Also, the mobile system 400 may further include a camera image processor (CIS), a modem such as a baseband chipset, and the like. For example, the modem may be a modem processor supporting communication such as GSM, GPRS, WCDMA, HSxPA, and the like.

The mobile system 400 and/or the components thereof may be mounted using various types of packages. For example, the mobile system 400 or the components thereof may mounted using packages such as package on package (PoP), ball grid arrays (BGAs), chip scale packages (CSPs), plastic leaded chip carrier (PLCC), plastic dual in-line package (PDIP), chip on board (COB), ceramic dual in-line package (CERDIP), plastic metric quad flat pack (MQFP), thin quad flat-pack (TQFP), small outline integrated circuit (SOIC), shrink small outline package (SSOP), thin small outline package (TSOP), thin quad flat-pack (TQFP), system in package (SIP), multichip package (MCP), wafer-level fabricated package (WFP), wafer-level processed stack package (WSP).

According to the aforementioned example embodiments, the memory device may include a write auxiliary circuit connected to a first auxiliary line for supplying a cell power voltage to a plurality of bit cells and a second auxiliary line for switching a supply direction of the cell power voltage, such that the speed of a write operation may increase and power consumption may decrease.

The memory device may preferentially perform a write auxiliary operation on a bit cell spaced apart from the write driver.

The memory device may reduce a decrease in a cell power voltage with respect to a bit cell adjacent to the write driver.

The memory device may improve a speed of pre-charge operation of a cell power voltage for a plurality of bit cells.

While some example embodiments have been illustrated and described above, it will be apparent to those skilled in the art that modifications and variations could be made without departing from the scope of the present disclosure as defined by the appended claims.

What is claimed is:

1. A memory device, comprising:
   a bit cell array including a plurality of bit cells configured to receive a cell power voltage from a first auxiliary line;
   a write driver connected to the bit cell array such that the plurality of bit cells includes a first bit cell spaced apart from the write driver in a column direction of the bit cell array and a second bit cell adjacent to the write driver in the column direction, the write driver configured to apply a bit line voltage, corresponding to write data, to a bit line extending in the column direction during a write operation; and
   a write auxiliary circuit connected to the first auxiliary line and a second auxiliary line extending in parallel to the first auxiliary line, the write auxiliary circuit configured to, for at least the first bit cell, lower a level of the cell power voltage,
   wherein the memory device is configured such that the cell power voltage is supplied to the first auxiliary line through the second auxiliary line, and is supplied sequentially from the first bit cell to the second bit cell through the first auxiliary line, and
   wherein a first end of the second auxiliary line is connected to the write auxiliary circuit and a second end of the second auxiliary line is connected to the first auxiliary line.

2. The memory device of claim 1, wherein the write auxiliary circuit is configured to lower the level of the cell power voltage for a portion of the plurality of bit cells.

3. The memory device of claim 2, wherein a level of the cell power voltage supplied to the second bit cell is the same as a level of the cell power voltage supplied to another bit cell adjacent to the second bit cell.

4. The memory device of claim 1, wherein the second auxiliary line is on the first auxiliary line.

5. The memory device of claim 1, further comprising:
   a bit cell dummy array on a side of the bit cell array opposite to the write driver,
   wherein the first auxiliary line is connected to the second auxiliary line in the bit cell dummy array.

6. The memory device of claim 1, wherein a direction in which the bit line voltage is applied and a direction in which the cell power voltage is applied are opposite to each other.

7. The memory device of claim 1, further comprising:
a reset boosting transistor configured to, based on an on/off state of the reset boosting transistor, electrically connect or separate the write auxiliary circuit from the first auxiliary line.

8. The memory device of claim 7, wherein the reset boosting transistor is turned off in a first period of the write operation, and the reset boosting transistor is turned on in a second period after the first period.

9. The memory device of claim 8, wherein, in the first period, the write auxiliary circuit lowers the level of the cell power voltage.

10. The memory device of claim 1, wherein both ends of the first auxiliary line and the second auxiliary line are connected to each other.

11. The memory device of claim 1, wherein the level of the cell power voltage supplied to the first bit cell is less than a level of the cell power voltage supplied to the second bit cell.

12. The memory device of claim 1, wherein
the second auxiliary line is isolated from the plurality of bit cells and other lines.

13. The memory device of claim 1, wherein the level of the cell power voltage supplied to the second bit cell has a minimum value after a point in time in which the level of the cell power voltage supplied to the first bit cell has a minimum value.

14. A memory device, comprising:
a bit cell array including a plurality of bit cells;
a bit cell dummy array on one side of the bit cell array;
a write driver on a side of the bit cell array opposite the bit cell dummy array, the write driver configured to apply a bit line voltage corresponding to write data to a bit line extending in a column direction of the bit cell array during a write operation; and
a write auxiliary circuit connected to a first auxiliary line and a second auxiliary line, the first auxiliary line configured to supply a cell power voltage to the plurality of bit cells, and the second auxiliary line connected to the first auxiliary line in the bit cell dummy array and configured to transfer the cell power voltage to the first auxiliary line.

15. The memory device of claim 14, wherein each of the plurality of bit cells is a volatile memory cell including two pull-up transistors, two pull-down transistors, and two pass gate transistors.

16. The memory device of claim 14, wherein
the write auxiliary circuit includes a plurality of write auxiliary transistors, each of the plurality of write auxiliary transistors configured to receive a write auxiliary enable signal, and
the write auxiliary enable signal is set to a high level when the write operation is performed.

17. The memory device of claim 16, wherein, when the write auxiliary enable signal is set to the high level, the second auxiliary line is discharged.

18. The memory device of claim 14, wherein the second auxiliary line is connected to at least one of the plurality of bit cells.

19. The memory device of claim 14, wherein
the bit cell array further includes at least one strap cell between bit cells arranged in the column direction among the plurality of bit cells, and
the first auxiliary line and the second auxiliary line are connected to each other through the at least one strap cell.

20. A memory device, comprising:
a bit cell array including a plurality of bit cells;
a plurality of bit lines in a lower auxiliary line layer on the bit cell array and configured to extend in a column direction of the bit cell array;
a plurality of first auxiliary lines in the lower auxiliary line layer and extending in parallel with the plurality of bit lines, the plurality of first auxiliary lines configured to apply a cell power voltage to the plurality of bit cells; and
a plurality of second auxiliary lines in an upper auxiliary line layer on the lower auxiliary line layer and in parallel with the plurality of first auxiliary lines, the plurality of second auxiliary lines connected to the plurality of first auxiliary lines in a bit cell dummy array on one side of the bit cell array such that a direction in which a bit line voltage is applied and a direction in which the cell power voltage is applied are opposite to each other.

* * * * *